US011735277B2

(12) United States Patent
Ito et al.

(10) Patent No.: US 11,735,277 B2
(45) Date of Patent: Aug. 22, 2023

(54) SEMICONDUCTOR MEMORY DEVICE INCLUDIND BOOSTING CIRCUIT THAT CHANGES GENERATED VOLTAGES IN WRITE OPERATION

(71) Applicant: Kioxia Corporation, Tokyo (JP)

(72) Inventors: Tomohiko Ito, Kawasaki Kanagawa (JP); Kazuto Uehara, Sagamihara Kanagawa (JP)

(73) Assignee: Kioxia Corporation, Tokyo (JP)

( * ) Notice: Subject to any disclaimer, the term of this patent is extended or adjusted under 35 U.S.C. 154(b) by 65 days.

(21) Appl. No.: 17/470,002

(22) Filed: Sep. 9, 2021

(65) Prior Publication Data
US 2022/0310177 A1    Sep. 29, 2022

(30) Foreign Application Priority Data

Mar. 23, 2021    (JP) .............................. 2021-048933

(51) Int. Cl.
| | | |
|---|---|---|
| *G11C 16/04* | (2006.01) | |
| *G11C 16/30* | (2006.01) | |
| *G11C 16/08* | (2006.01) | |
| *G11C 16/34* | (2006.01) | |
| *G11C 16/10* | (2006.01) | |

(52) U.S. Cl.
CPC .......... *G11C 16/30* (2013.01); *G11C 16/0483* (2013.01); *G11C 16/08* (2013.01); *G11C 16/10* (2013.01); *G11C 16/3459* (2013.01)

(58) Field of Classification Search
CPC ..... G11C 16/30; G11C 16/0483; G11C 16/08; G11C 16/10; G11C 16/3459; G11C 16/32
USPC ...................................................... 365/185.22
See application file for complete search history.

(56) References Cited

U.S. PATENT DOCUMENTS

| | | | |
|---|---|---|---|
| 9,698,676 B1 * | 7/2017 | Huynh | .................... H02M 3/07 |
| 10,553,291 B2 * | 2/2020 | Lee | .................. G11C 29/12015 |
| 2019/0179573 A1 | 6/2019 | Hsu et al. | |

FOREIGN PATENT DOCUMENTS

| | | |
|---|---|---|
| JP | 2013225359 A | 10/2013 |
| JP | 2016170847 A | 9/2016 |

* cited by examiner

*Primary Examiner* — Tha-O H Bui
(74) *Attorney, Agent, or Firm* — Holtz, Holtz & Volek PC

(57) ABSTRACT

According to one embodiment, a semiconductor memory device includes a first memory cell and a first boosting circuit. The first boosting circuit generates a first voltage, a second voltage, and a third voltage lower than the second voltage at a first output terminal. The first, second and third voltages is used for a write operation. The write operation includes a first program operation and a first verify operation executed after the first program operation. The first boosting circuit generates the first voltage at the first output terminal during the first program operation, generates the third voltage at the first output terminal at end of the first program operation, generates the second voltage at the first output terminal during the first verify operation, and then generates the first voltage to the first output terminal during the first verify operation.

20 Claims, 14 Drawing Sheets

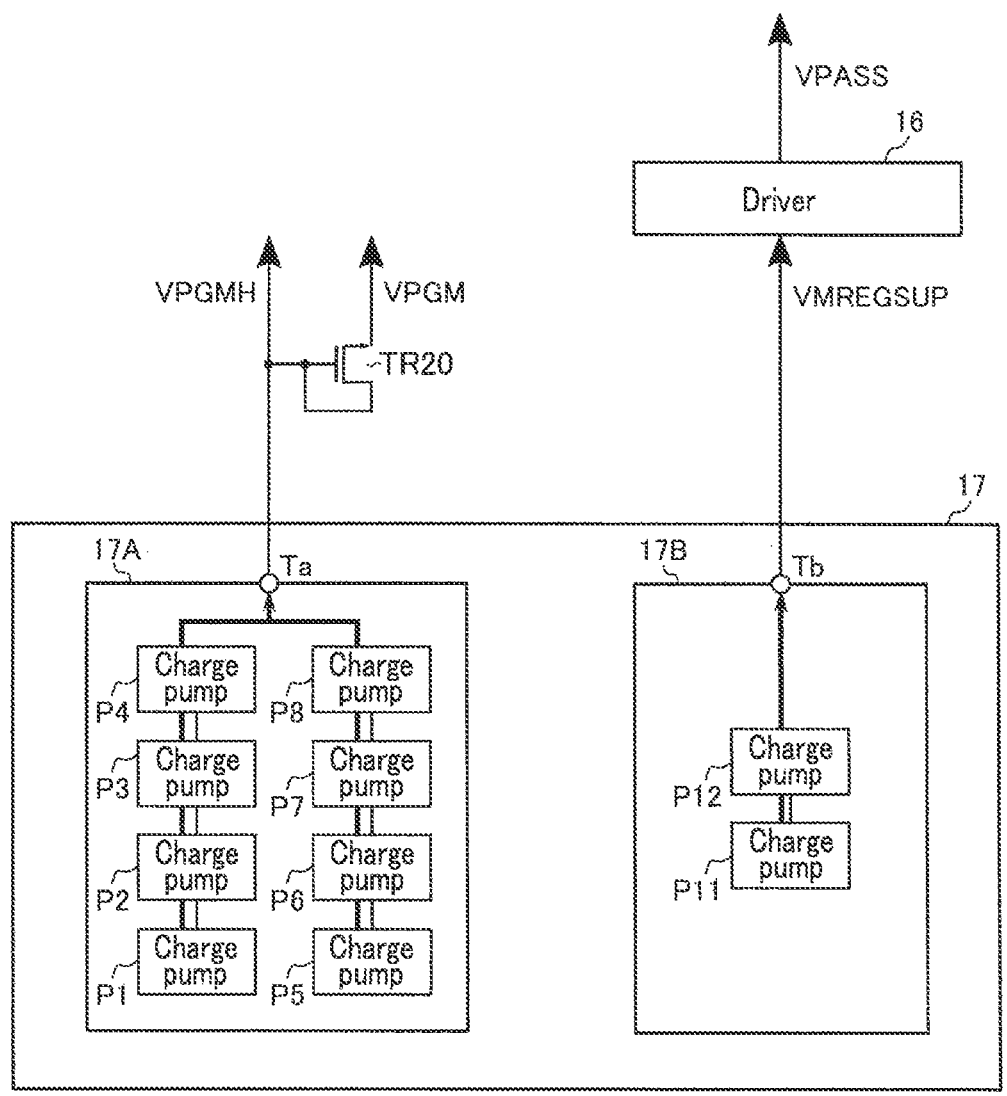
F I G. 5

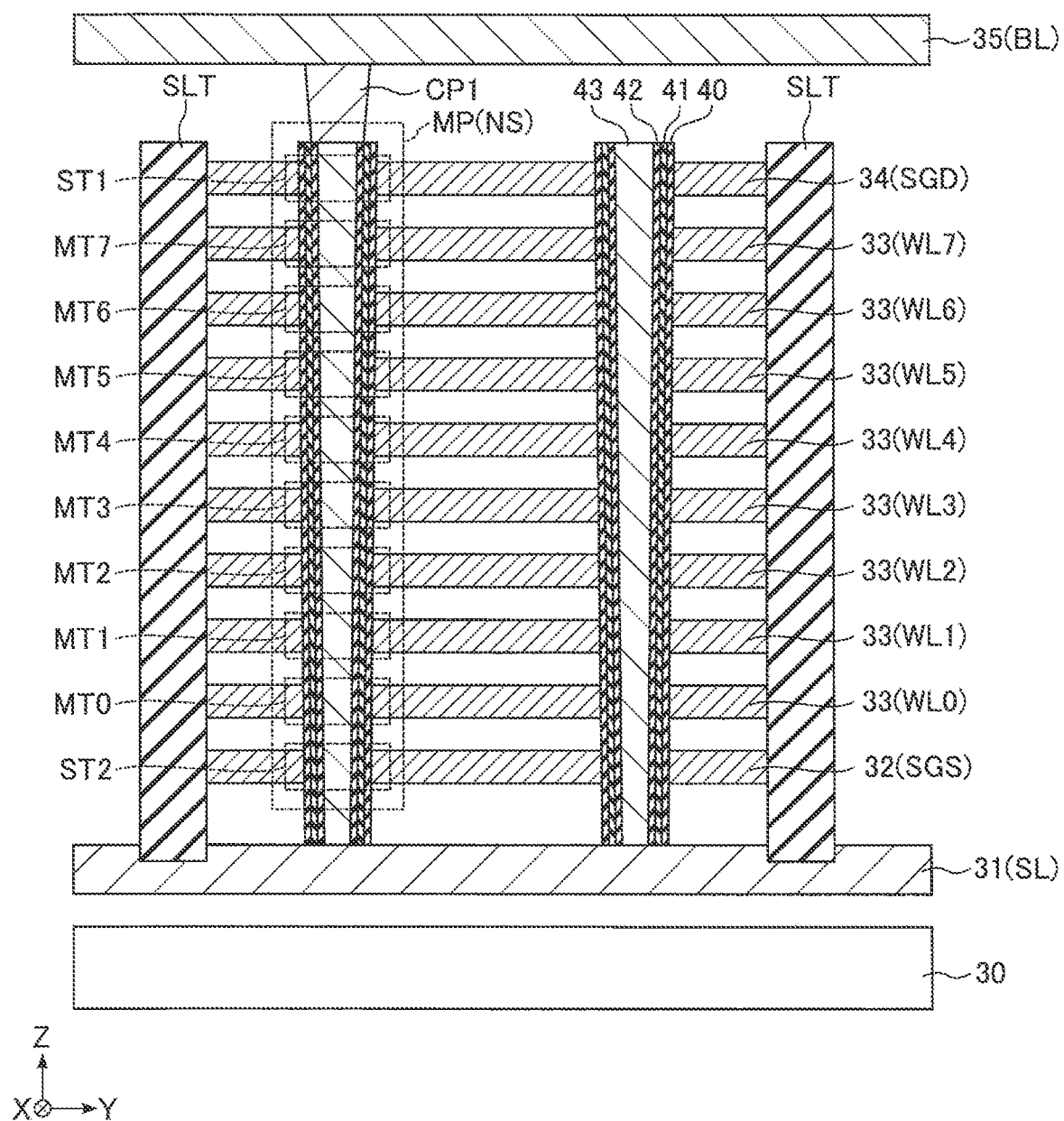
F I G. 8

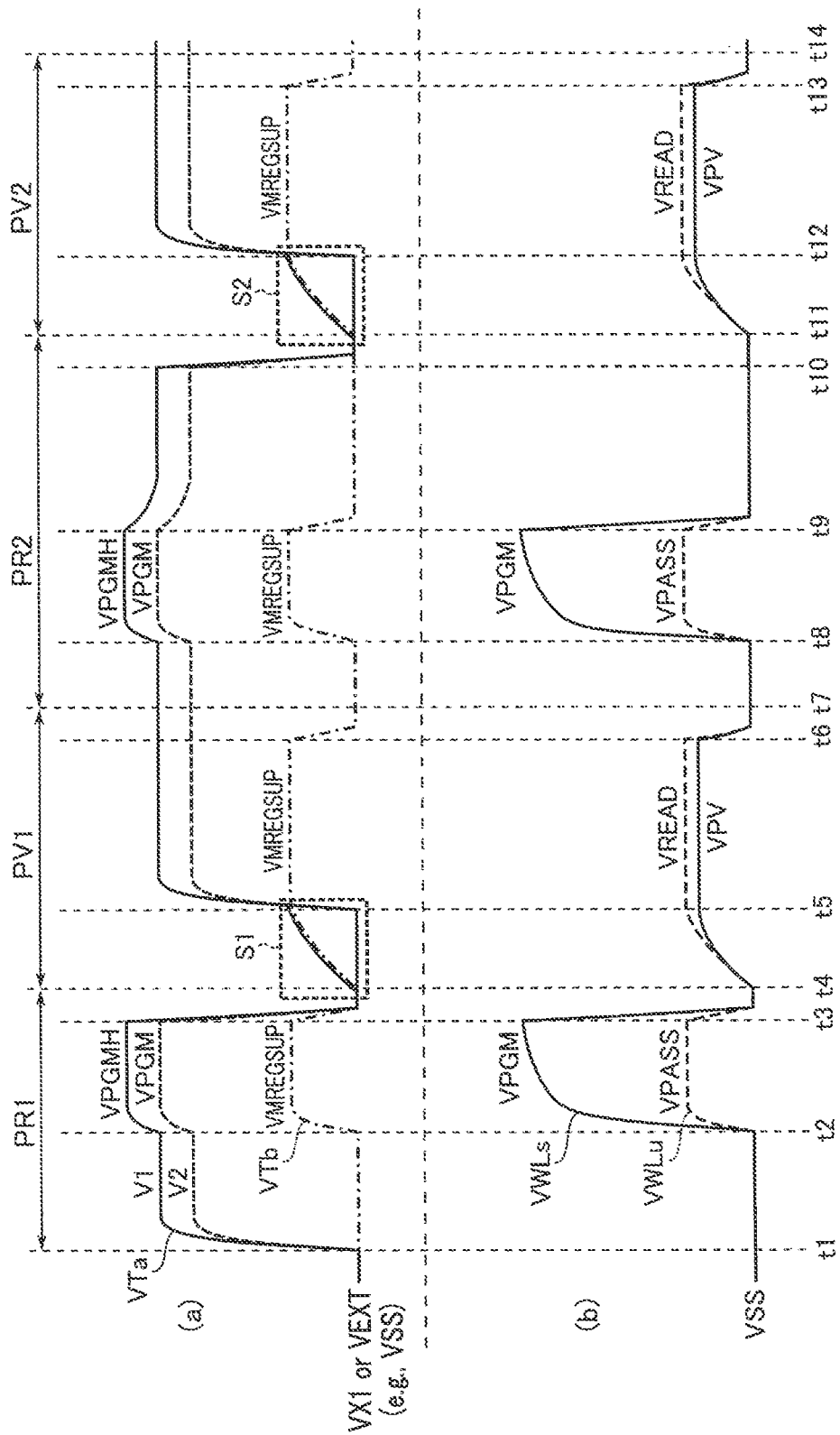
F I G. 9

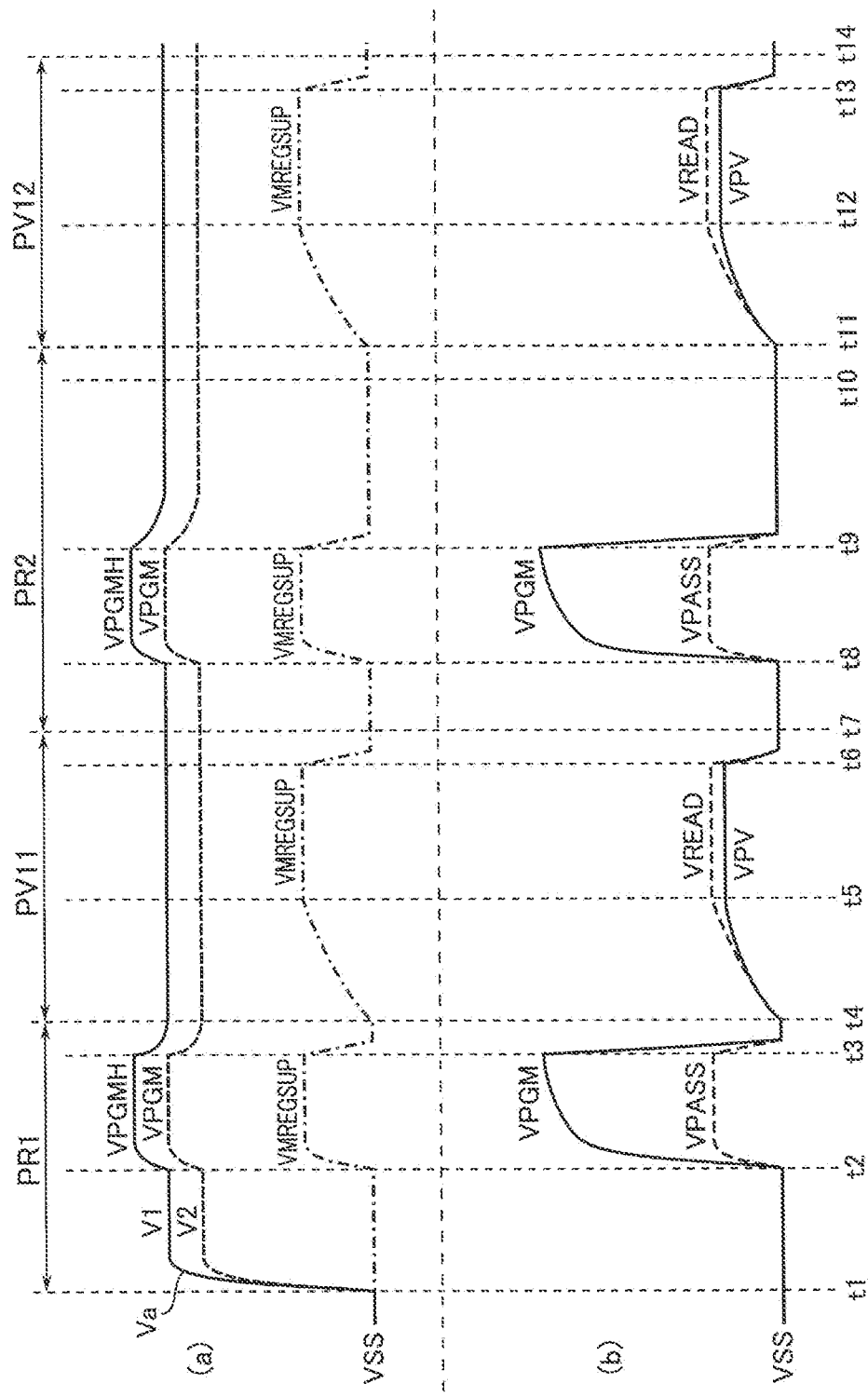
F I G. 12

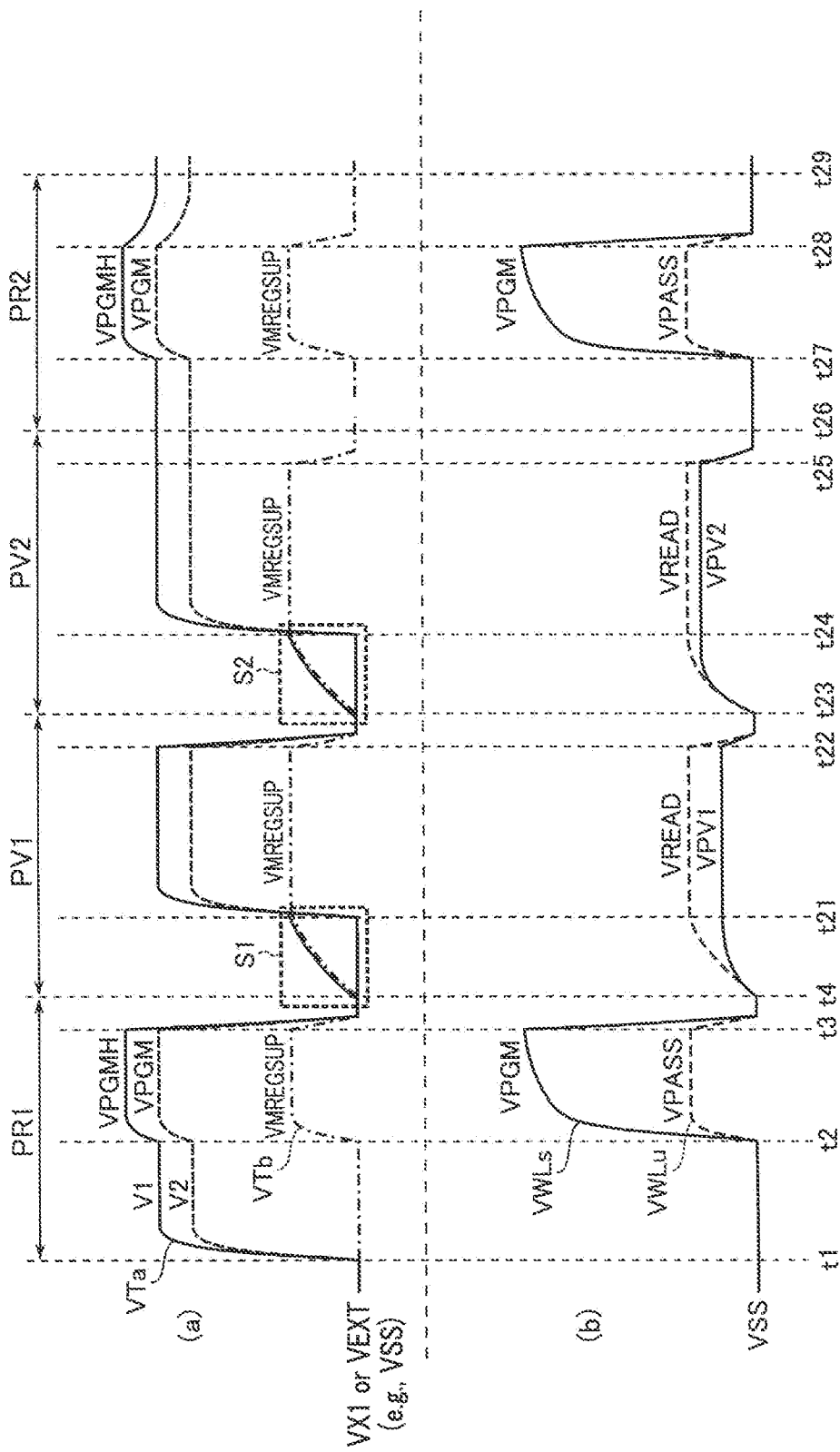
F I G. 13

SEMICONDUCTOR MEMORY DEVICE INCLUDIND BOOSTING CIRCUIT THAT CHANGES GENERATED VOLTAGES IN WRITE OPERATION

CROSS-REFERENCE TO RELATED APPLICATIONS

This application is based upon and claims the benefit of priority from the Japanese Patent Application No. 2021-048933, filed Mar. 23, 2021, the entire contents of which are incorporated herein by reference.

FIELD

Embodiments described herein relate generally to a semiconductor memory device.

BACKGROUND

A semiconductor memory device including a NAND-type flash memory capable of storing data in a non-volatile manner is known.

BRIEF DESCRIPTION OF THE DRAWINGS

FIGS. 5-7 are diagrams showing a boosted state of the voltage generation circuit during a write operation.

FIG. 8 is a cross-sectional view of a memory cell transistor in the memory cell array included in the semiconductor memory device according to the first embodiment.

FIG. 9 is a diagram showing a voltage waveform in a write operation according to the first embodiment.

FIG. 12 is a diagram showing a voltage waveform in a write operation of a semiconductor memory device according to a comparative example.

FIG. 13 is a diagram showing a voltage waveform in a write operation according to a first example of a second embodiment.

DETAILED DESCRIPTION

Figure 1:
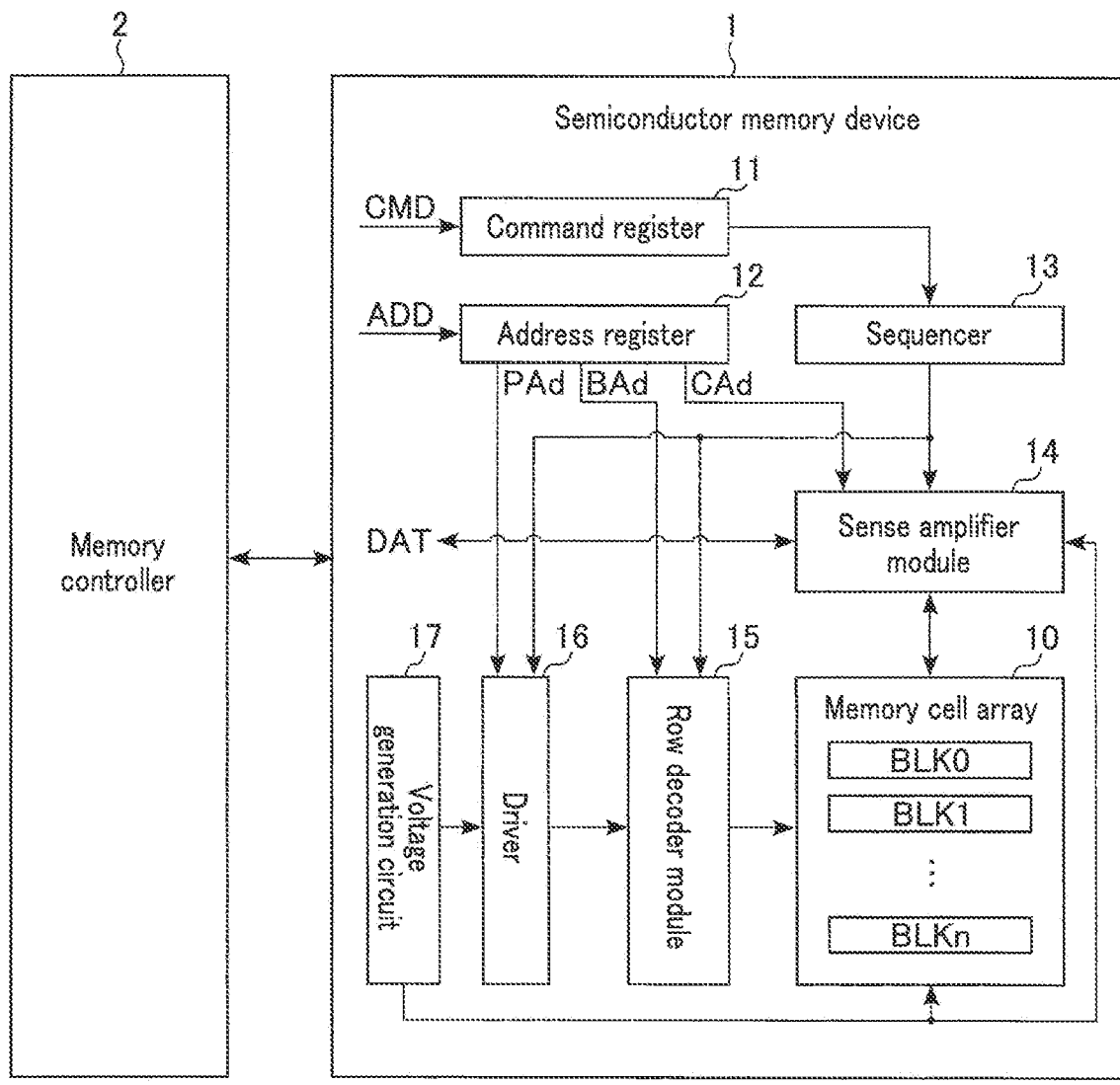
FIG. 1 is a block diagram showing a configuration example of a semiconductor memory device according to a first embodiment.

In general, according to one embodiment, a semiconductor memory device includes a first memory cell and a first boosting circuit. The first boosting circuit includes a first output terminal and is configured to generate a first voltage, a second voltage, and a third voltage lower than the second voltage at the first output terminal. The first voltage, the second voltage and the third voltage are used for a write operation. The write operation includes a first program operation and a first verify operation. The first boosting circuit is configured to: generate the first voltage at the first output terminal during the first program operation; generate the third voltage at the first output terminal at end of the first program operation; generate the second voltage at the first output terminal during the first verify operation; and then generate the first voltage to the first output terminal during the first verify operation.

In the description that follows, components having the same function and configuration will be assigned a common reference numeral. The embodiments to be described below are shown as an example of a device or a method for embodying the technical idea of the embodiments, and are not intended to limit the material, shape, structure, arrangement, etc. of components to those described below.

Each functional block can be implemented in the form of hardware, computer software, or a combination thereof. The functional blocks are not necessarily separated as in the following example. For example, some of the functions may be executed by a functional block different from the functional block to be described as an example. In addition, the functional blocks to be described as an example may be divided into smaller functional sub-blocks.

1. First Embodiment

Hereinafter, a description will be given of a semiconductor memory device according to a first embodiment.

1. 1 Configuration of Semiconductor Memory Device 1

1. 1. 1 Overall Configuration of Semiconductor Memory Device 1

FIG. 1 is a block diagram showing a configuration example of a semiconductor memory device 1 according to the first embodiment. The semiconductor memory device 1 is, for example, a NAND-type flash memory capable of storing data in a non-volatile manner. The semiconductor memory device 1 can be controlled by an external memory controller 2.

As shown in FIG. 1, the semiconductor memory device 1 includes, for example, a memory cell array 10, a command register 11, an address register 12, a sequencer 13, a sense amplifier module 14, a row decoder module 15, a driver 16, and a voltage generation circuit 17.

The memory cell array 10 includes a plurality of blocks BLK0, BLK1, BLK2, . . . , BLKn (where n is a natural number equal to or greater than 0). The block BLKn includes a plurality of memory cells capable of storing data in a non-volatile manner. The block BLKn is used as, for example, a unit of data erasure. In the memory cell array 10, a plurality of bit lines and a plurality of word lines are provided. Each memory cell is associated with, for example, a single bit line and a single word line. A detailed configuration of the memory cell array 10 will be described later.

The command register 11 stores a command CMD received by the semiconductor memory device 1 from the memory controller 2. The command CMD includes, for example, an order to cause the sequencer 13 to perform a read operation, a write operation, an erase operation, etc.

The address register 12 stores address information ADD received by the semiconductor memory device 1 from the memory controller 2. The address information ADD includes, for example, a block address BAd, a page address PAd, and a column address CAd. The block address BAd, the page address PAd, and the column address CAd are used for, for example, selection of a block BLKn, a word line, and a bit line, respectively.

The sequencer (or control circuit) 13 controls the entire operation of the semiconductor memory device 1. For example, the sequencer 13 controls, based on the command CMD stored in the command register 11, the sense amplifier module 14, the row decoder module 15, the voltage generation circuit 17, etc., and performs the read operation, the write operation, the erase operation, etc. on the memory cells.

In the write operation, the sense amplifier module 14 applies a desired voltage to each bit line according to write data DAT received from the memory controller 2. In the read operation, the sense amplifier module 14 determines data stored in the memory cell based on the voltage of the bit line. The sense amplifier module 14 transfers the result of the data determination to the memory controller 2 as read data DAT.

The row decoder module 15 selects one of the blocks BLKn in the memory cell array 10 based on the block address BAd stored in the address register 12. The row decoder module 15 transfers, to a selected word line in the selected block BLKn, a voltage applied to a signal line corresponding to the selected word line, for example.

The driver 16 receives a plurality of voltages from the voltage generation circuit 17. The driver 16 selects a required voltage from the voltages supplied from the voltage generation circuit 17 according to the write operation, the read operation, and the erase operation, and supplies the selected voltage to the row decoder module 15 via a plurality of signal lines. Based on, for example, the page address PAd stored in the address register 12, the driver 16 applies the voltage supplied from the voltage generation circuit 17 to the signal line corresponding to the selected word line.

The voltage generation circuit 17 generates a plurality of voltages required for the write operation, the read operation, and the erase operation. The voltage generation circuit 17 supplies the generated voltages to the driver 16, the memory cell array 10, the sense amplifier module 14, etc. A detailed configuration of the voltage generation circuit 17 will be described later.

The semiconductor memory device 1 and the memory controller 2 described above may configure, in combination, a single semiconductor device. Examples of such a semiconductor device include a memory card such as an SD™ card and a solid-state drive (SSD).

1. 1. 2 Circuit Configuration of Semiconductor Memory Device 1

Hereinafter, as a circuit configuration of the semiconductor memory device 1 according to the first embodiment, the memory cell array 10, the row decoder module 15, and the voltage generation circuit 17 will be described in order.

1. 1. 2. 1 Circuit Configuration of Memory Cell Array 10

The memory cell array 10 includes a plurality of blocks BLK0 to BLKn, as described above. Herein, one of the blocks BLK0 to BLKn included in the memory cell array 10 is shown as a block BLKn.

Figure 2:
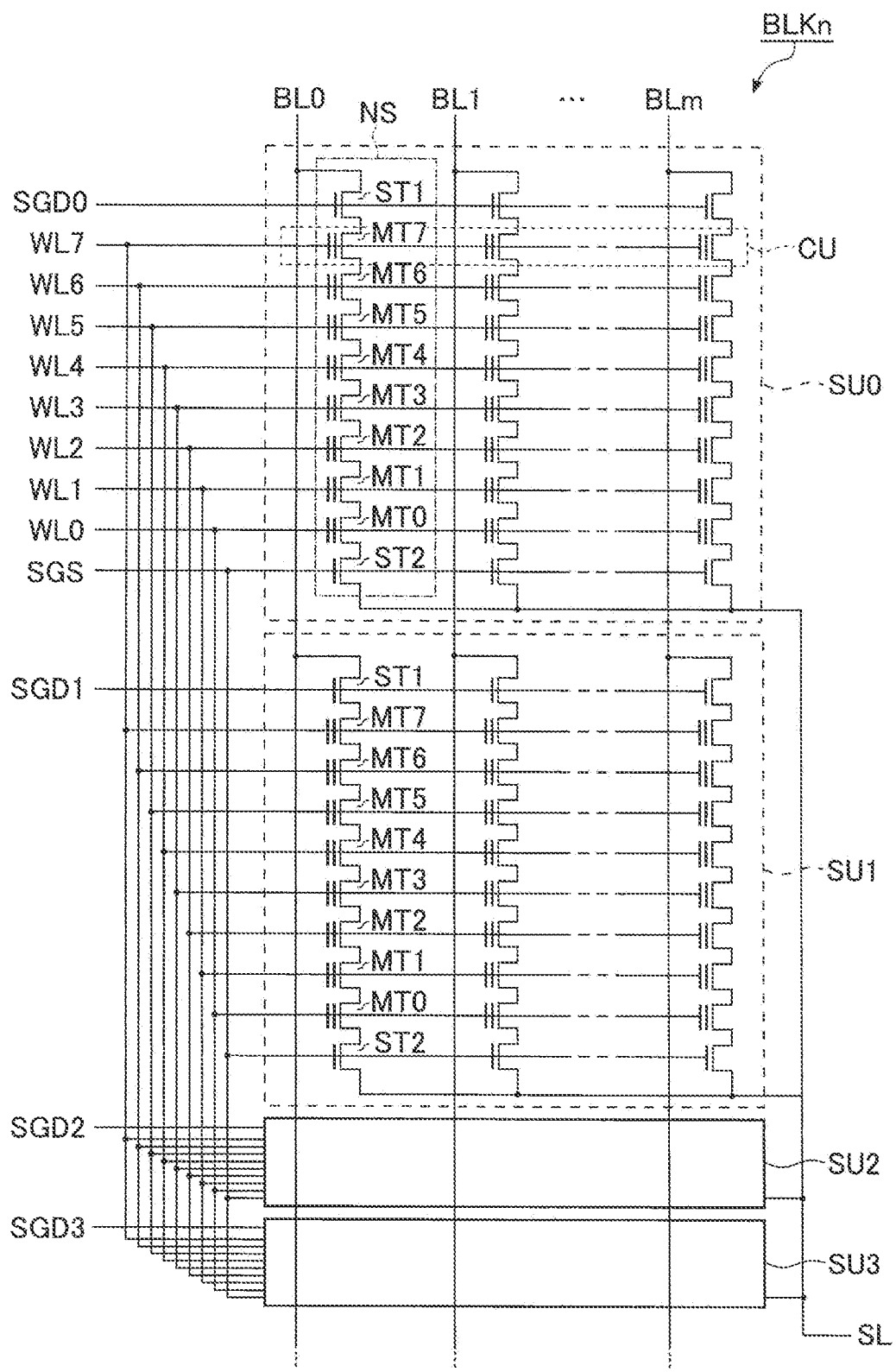
FIG. 2 is a circuit diagram of a block in a memory cell array included in the semiconductor memory device according to the first embodiment.

FIG. 2 is a circuit diagram of the block BLKn in the memory cell array 10 included in the semiconductor memory device 1 according to the first embodiment. The block BLKn includes, for example, four string units SU0 to SU3. Hereinafter, it is assumed that the term "string unit SU" refers to each of the string units SU0 to SU3.

The string unit SU includes a plurality of NAND strings NS respectively associated with bit lines BL0 to BLm (where m is a natural number equal to or greater than 0). Each NAND string NS includes, for example, memory cell transistors MT0 to MT7, and select transistors ST1 and ST2. Each of the memory cell transistors MT0 to MT7 includes a control gate and a charge storage layer, and stores data in a non-volatile manner. Each of the select transistors ST1 and ST2 is used for selection of a string unit SU in various operations. Hereinafter, it is assumed that the term "memory cell transistor MT" refers to each of the memory cell transistors MT0 to MT7.

In each NAND strings NS, the memory cell transistors MT0 to MT7 are coupled in series. A drain of the select transistor ST1 is coupled to a bit line BL associated therewith. A source of the select transistor ST1 is coupled to one end of the memory cell transistors MT0 to MT7 coupled in series. A drain of the select transistor ST2 is coupled to the other end of the memory cell transistors MT0 to MT7 coupled in series. A source of the select transistor ST2 is coupled to a source line SL.

In a single block BLKn, control gates of the memory cell transistors MT0 to MT7 are respectively coupled to word lines WL0 to WL7. Gates of select transistors ST1 in the string units SU0 to SU3 are respectively coupled to the select gate lines SGD0 to SGD3. Gates of select transistors ST2 in the string units SU0 to SU3 are coupled to a select gate line SGS.

In the above-described circuit configuration of the memory cell array 10, the bit line BL is shared among a plurality of NAND strings NS to which the same column address is assigned in each string unit SU. The source line SL is, for example, shared among a plurality of blocks BLK.

A group of memory cell transistors MT coupled to the common word line WL in each string unit SU is referred to as, for example, a "cell unit CU". The storage capacity of a cell unit CU including each memory cell transistor MT that stores 1-bit data is defined as, for example, "1-page data". The cell unit CU may have a storage capacity of two or more pages of data according to the number of bits of data stored in the memory cell transistor MT.

The circuit configuration of the memory cell array 10 included in the semiconductor memory device 1 according to the first embodiment is not limited to the above-described configuration. For example, the number of string units SU included in the block BLKn, and the number of memory cell transistors MT and the select transistors ST1 and ST2 included in each NAND string NS may be set to a given number.

1. 1. 2. 2 Circuit Configuration of Row Decoder Module 15

Figure 3:
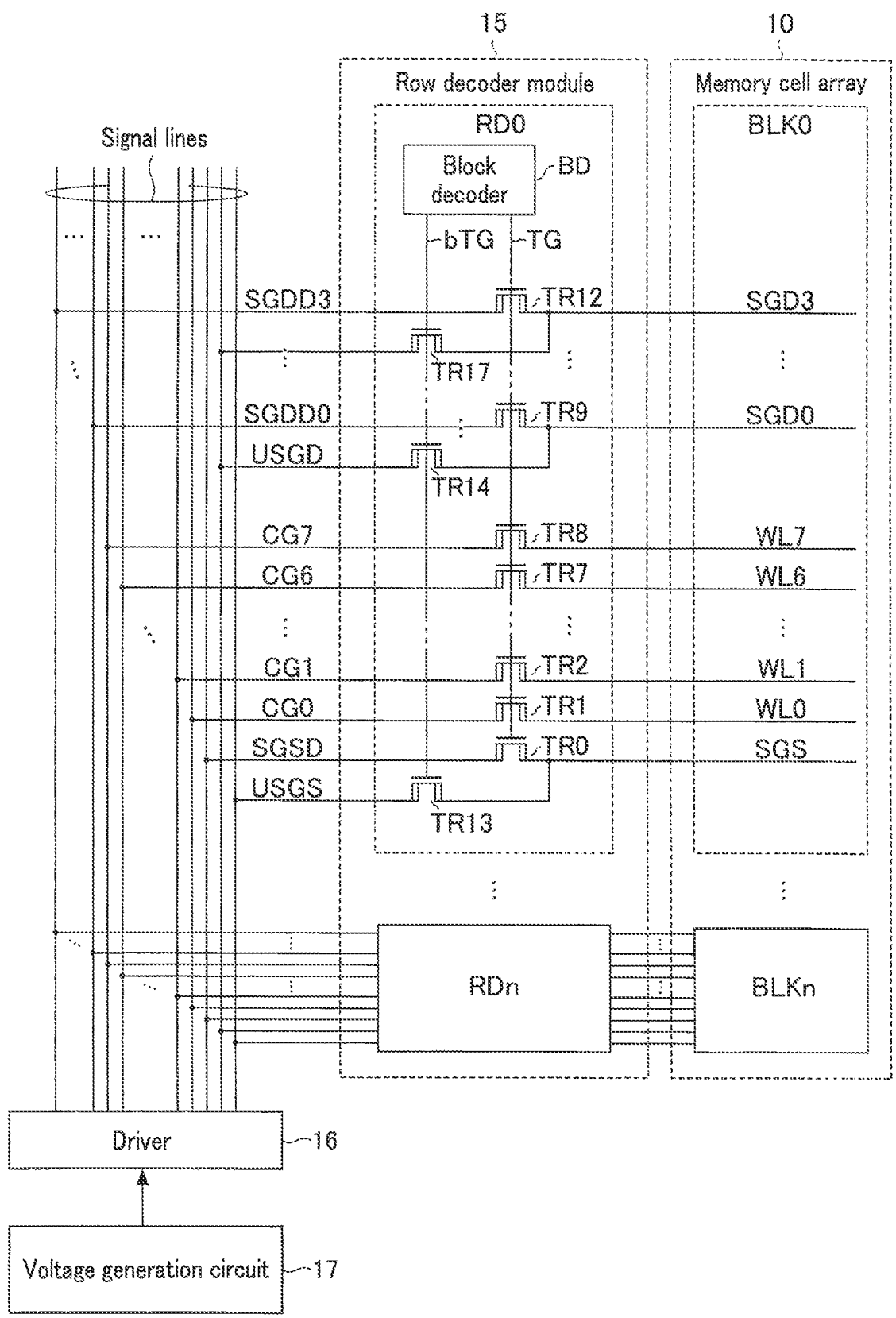
FIG. 3 is a diagram showing a circuit configuration of a row decoder module included in the semiconductor memory device according to the first embodiment.

FIG. 3 is a diagram showing a circuit configuration of the row decoder module 15 included in the semiconductor memory device 1 according to the first embodiment. The row decoder module 15 includes a plurality of row decoders RD0, RD1, . . . , RDn. The row decoders RD0 to RDn respectively correspond to blocks BLK0 to BLKn. FIG. 3 shows a detailed circuit configuration of the row decoder RD0; however, the other row decoders RDn have a circuit configuration similar to that of the row decoder RD0.

The row decoder RD0 includes, for example, a block decoder BD, transfer gate lines TG and bTG, and transistors TR0 to TR17. Hereinafter, each of the transistors TR0 to TR17 will also be referred to as a "transistor TR".

The block decoder BD decodes a block address BAd. The block decoder BD applies a predetermined voltage to each of the transfer gate lines TG and bTG based on the result of the decoding of the block address BAd. Specifically, the block decoder BD applies, to the transfer gate line bTG, an inversion signal of the signal to be applied to the transfer gate line TG. That is, the voltage to be applied to the transfer gate line TG and the voltage to be applied to the transfer gate line bTG are in a complementary relationship.

Each of the transistors TR0 to TR17 is a high withstand-voltage n-channel MOS field-effect transistor. Gates of the transistors TR0 to TR12 are coupled to the transfer gate line TG. Gates of the transistors TR13 to TR17 are coupled to the transfer gate line bTG. That is, each of the transistors TR0 to TR17 is controlled by the block decoder BD. Each of the transistors TR0 to TR17 is coupled to the driver 16 via the signal line. The signal line is shared among a plurality of blocks ELK. Furthermore, the driver 16 is coupled to the voltage generation circuit 17.

A drain of the transistor TR0 is coupled to a signal line SGSD. The signal line SGSD is shared among a plurality of blocks ELK, and is used as a global transfer gate line corresponding to the selected block BLKn. A source of the transistor TR0 is coupled to the select gate line SGS. The select gate line SGS is used as a local transfer gate line provided for each block.

Drains of the transistors TR1 to TR8 are respectively coupled to the signal lines CG0 to CG7. Each of the signal lines CG0 to CG7 is used as a global word line shared by the blocks BLK. Sources of the transistors TR1 to TR8 are respectively coupled to the word lines WL0 to WL7. The word lines WL0 to WL7 are respectively used as local word lines provided in each block.

Drains of the transistors TR9 to TR12 are respectively coupled to signal lines SGDD0 to SGDD3. Each of the signal lines SGDD0 to SGDD3 is shared among the blocks BLK, and is used as a global transfer gate line corresponding to the selected block BLKn. Sources of the transistors TR9 to TR12 are respectively coupled to the select gate lines SGD0 to SGD3. Each of the select gate lines SGD0 to SGD3 is used as a local transfer gate line provided for each block.

A drain of the transistor TR13 is coupled to a signal line USGS. A source of the transistor TR13 is coupled to the select gate line SGS. Drains of the transistors TR14 to TR17 are coupled to the signal line USGD. Sources of the transistors TR14 to TR17 are respectively coupled to the select gate lines SGD0 to SGD3. Each of the signal lines USGS and USGD is shared among the blocks BLK, and is used as a global transfer gate line corresponding to the non-selected block BLKn.

With the above-described configuration, the row decoder module 15 selects a block BLKn based on the result of the decoding of the block address BAd. That is, in various operations, the block decoder BD corresponding to the selected block BLKn applies an H-level voltage and an L-level voltage to the transfer gate lines TG and bTG. A block decoder BD corresponding to the non-selected block BLKn respectively applies the L-level voltage and the H-level voltage to the transfer gate lines TG and bTG.

The row decoder module 15 included in the semiconductor memory device 1 according to the first embodiment is not limited to the circuit configuration described above. The number of transistors TR included in the row decoder module 15 may be suitably varied according to the number of memory cell transistors, select transistors, etc. provided in each block BLKn. Herein, the transistor TR included in the row decoder RD will also be referred to as a "transfer switch WLSW".

1. 1. 2. 3 Circuit Configuration of Voltage Generation Circuit 17

Figure 4:
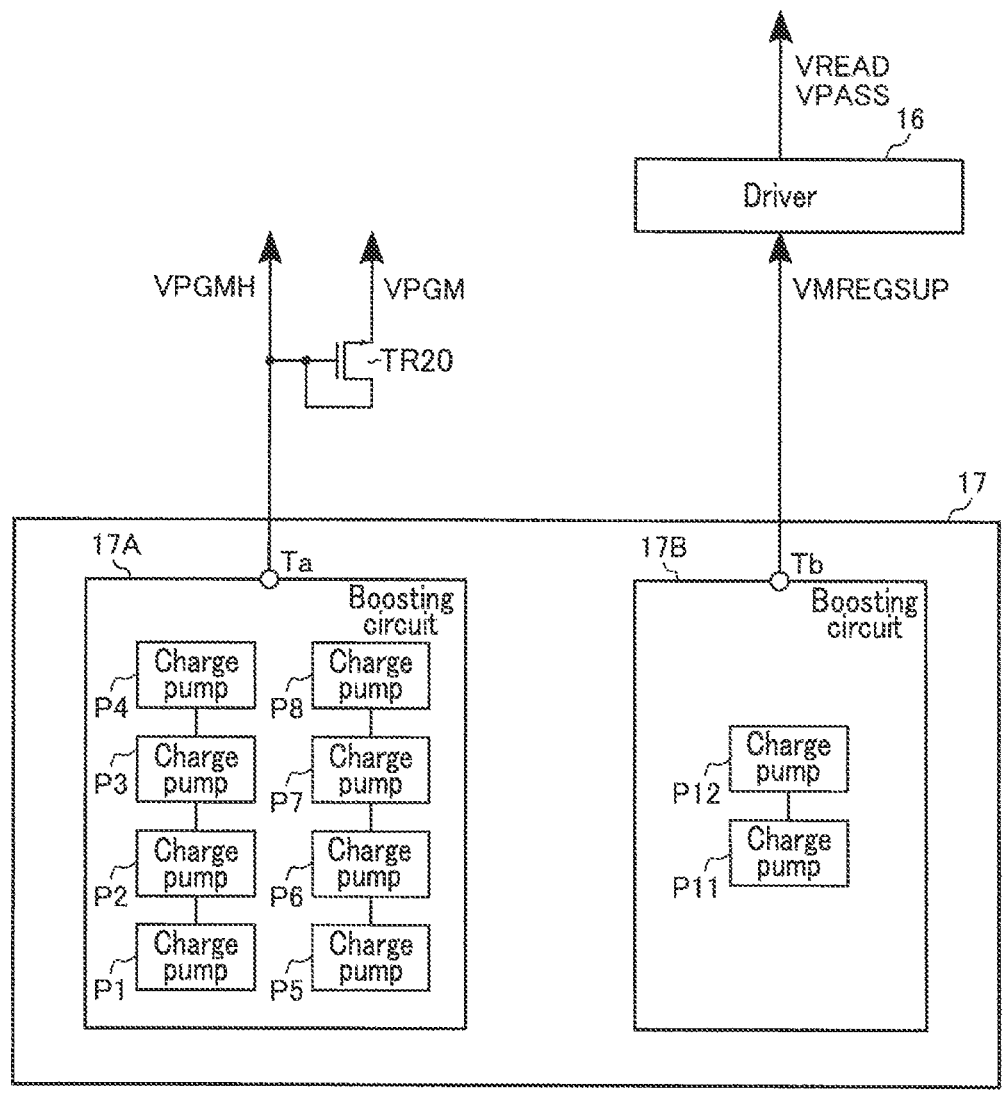
FIG. 4 is a diagram showing a circuit configuration of a voltage generation circuit included in the semiconductor memory device according to the first embodiment.
Figure 6:
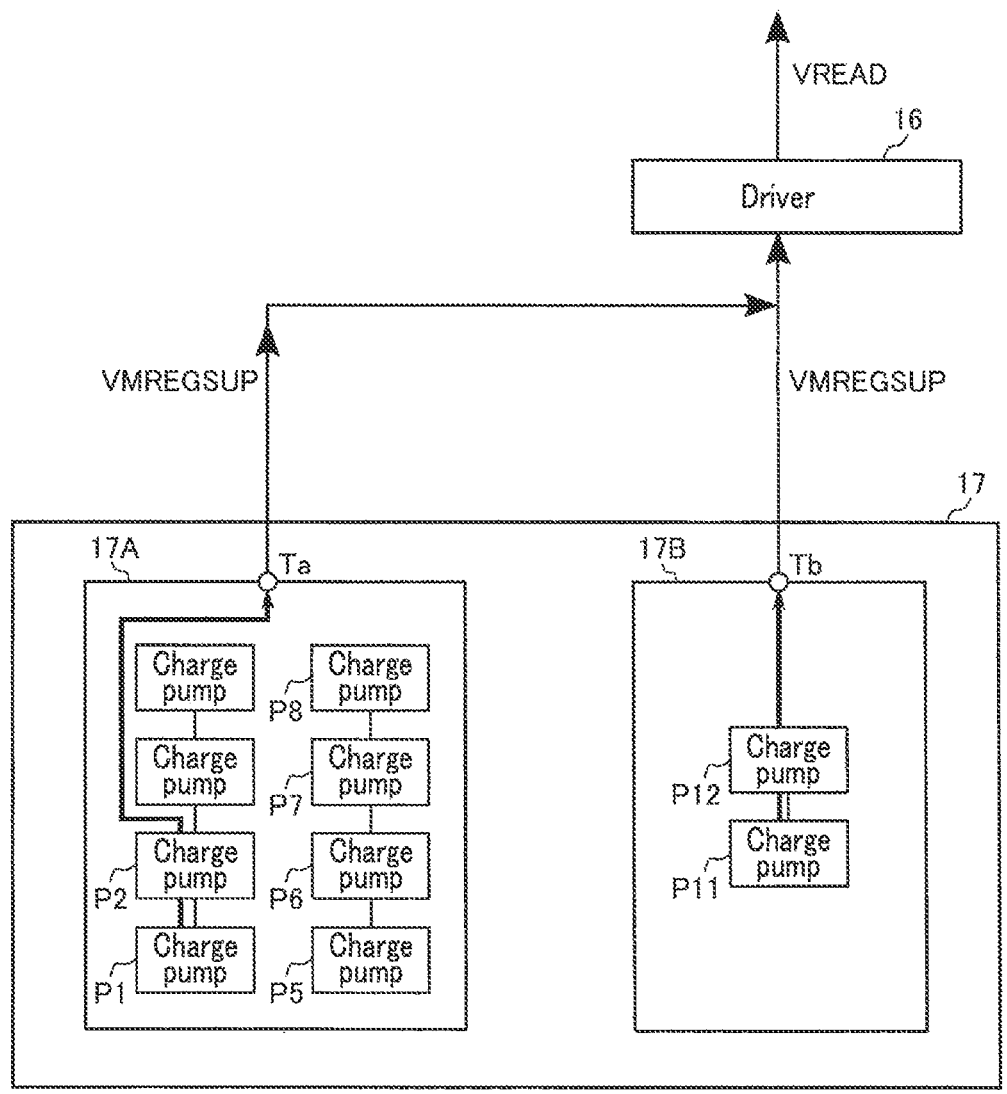
Figure 7:
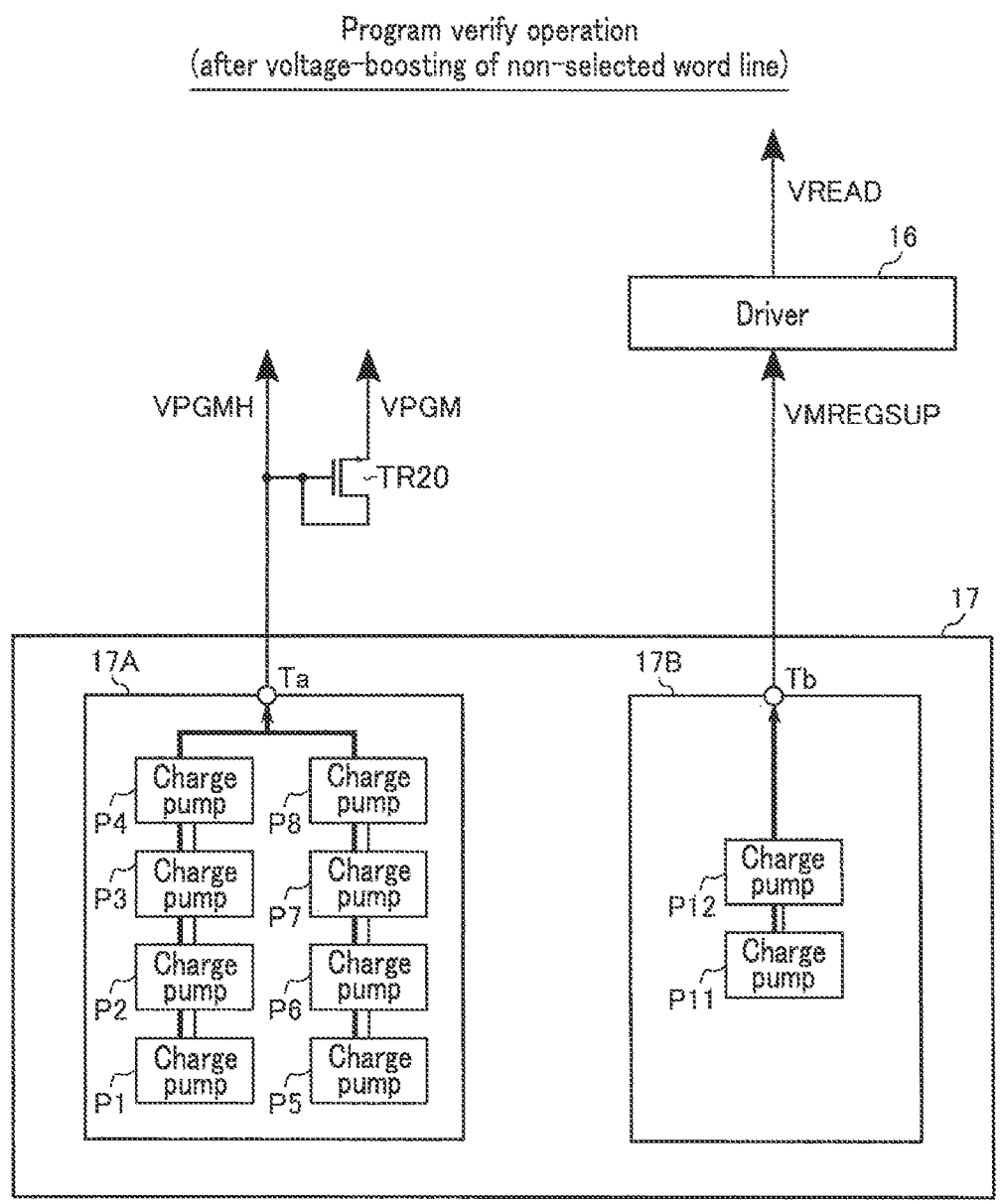

FIG. 4 is a diagram showing a circuit configuration of the voltage generation circuit 17 included in the semiconductor memory device 1 according to the first embodiment. FIGS. 5, 6 and 7 are diagrams showing a boosted state in the voltage generation circuit 17 during the write operation. The voltage generation circuit 17 includes, for example, boosting circuits 17A and 17B.

The boosting circuit 17A is, for example, a circuit for generating a high voltage from a power-supply voltage VDD. The boosting circuit 17A generates a voltage used mainly in a program operation of the write operation, such as a voltage VPGMH.

The voltage VPGMH is supplied to the row decoder module 15 from the boosting circuit 17A during the write operation. The voltage VPGMH is equal to or greater than a threshold voltage Vth of a transfer transistor that transfers the write voltage VPGM, and is higher than a write voltage VPGM. The voltage VPGMH is supplied to a gate of the transfer transistor that transfers the write voltage VPGM in the row decoder module 15.

The write voltage VPGM is generated from the voltage VPGMH. The voltage VPGMH is supplied to a gate and a drain of a transistor TR20, and the write voltage VPGM is supplied to the row decoder module 15 from a source of the transistor TR20. The write voltage VPGM is a voltage to be applied to a write target word line (hereinafter referred to as a "selected word line WLs") in the program operation of the write operation. The program operation will be described later.

In the present embodiment, as shown in FIG. 6, the boosting circuit 17A generates a voltage to be auxiliary used in a program verify operation of the write operation, namely, a voltage VMREGSUP. The boosting circuit 17A supplies the generated voltage VMREGSUP to the driver 16. The driver 16 receives, as an input voltage, the voltage VMREGSUP, and generates a voltage VREAD using the voltage VMREGSUP. That is, the driver 16 generates a voltage VREAD by adjusting the voltage value, etc. of the voltage VMREGSUP. The driver 16 outputs the generated voltage VREAD to the row decoder module 15. The voltage VMREGSUP may be lower than the voltage VPGMH (or the write voltage VPGM), or higher than the voltage VPGMH. The voltage VREAD is a voltage to be applied to a write non-target word line (hereinafter referred to as "non-selected word lines WLu") in the program verify operation of the write operation and the read operation. The voltage VREAD is a voltage that causes the memory cell transistor MT to be turned on regardless of data stored in the memory cell transistor MT. Details of the program verify operation will be described later.

Hereinafter, a description will be given of the circuit configuration of the boosting circuit 17A with reference to FIG. 4. The boosting circuit 17A includes, for example, a plurality of charge pumps P1, P2, . . . , and P8. The charge pumps P1 to P4 are coupled in series. Similarly, the charge pumps P5 to P8 are also coupled in series. Each of the charge pumps boosts the input voltage, and generates a voltage that is i times higher than the input voltage (where i is a natural number equal to or greater than 2). For example, each of the charge pumps P1 and P3 generates a voltage that is six times higher than the input voltage. Each of the charge pumps P2 and P4 generates a voltage that is double the input voltage.

Switches (not illustrated) are provided between the charge pumps P1 to P4 and between the charge pumps P5 to P8. By controlling the on/off of the switch, each of the charge pumps or a group of charge pumps coupled in series is capable of boosting the input voltage and outputting the boosted voltage, independently from the other charge pumps.

The four charge pumps P1 to P4 coupled in series sequentially boost the input voltages input to the charge pump P1, and output a first voltage obtained by the boosting from an output terminal Ta. Similarly, the four charge pumps P5 to P8 coupled in series sequentially boost the input voltages input to the charge pump P5, and output the first voltage obtained by the boosting from the output terminal Ta. In the present embodiment, as shown in FIG. 5, the voltage VPGMH obtained by the boosting by the charge pumps P1 to P4 and P5 to P8 is output from the output terminal Ta.

By opening the switches provided between the charge pumps, some or all of the charge pumps P1 to P4 boost the input voltage, and output a second voltage obtained by the boosting from an output terminal provided in the boosting circuit 17A. Similarly, some or all of the charge pumps P5 to P8 boost the input voltage, and output the second voltage obtained by the boosting from the output terminal provided in the boosting circuit 17A. In the present embodiment, as shown in FIG. 6, the voltage VMREGSUP obtained by the boosting by the charge pumps P1 and P2 is output from the output terminal Ta.

With the charge pumps P1 to P4 and the charge pumps P5 to P8 provided, an amount of current to be supplied to the driver 16 is increased, thus accelerating boosting to a desired voltage. When the semiconductor memory device 1 includes a plurality of planes, voltages boosted using some of the charge pumps P1 to P8 can be independently supplied to the respective planes.

Next, a description will be given of the boosting circuit 17B. The boosting circuit 17B is, for example, a circuit for generating an intermediate voltage lower than the high voltage from the power-supply voltage VDD. The boosting circuit 17B generates a voltage that is used mainly in the program verify operation of the write operation and in a read operation, such as the voltage VMREGSUP. The boosting circuit 17B supplies the voltage VMREGSUP to the driver 16, as shown in FIGS. 6 and 7, during the program verify operation. Even though the voltage VMREGSUP is also supplied to the driver 16 from the boosting circuit 17A, it is mainly the boosting circuit 17B that supplies the voltage VMREGSUP to the driver 16.

The driver 16 receives the voltage VMREGSUP as an input voltage from the boosting circuits 17A and 17B, and generates the voltage VREAD using the voltage VMREGSUP. That is, the driver 16 adjusts the voltage value, etc. of the voltage VMREGSUP supplied from both the boosting circuits 17A and 17B, and generates the voltage VREAD. The driver 16 outputs the generated voltage VREAD to the row decoder module 15.

The boosting circuit 17B also generates a voltage used in the program operation of the write operation, such as a voltage VMREGSUP, as shown in FIG. 5. The boosting circuit 17B supplies the voltage VMREGSUP to the driver 16 during the program operation. The driver 16 receives the voltage VMREGSUP as an input voltage, and generates a voltage VPASS using the voltage VMREGSUP. That is, the driver 16 generates a voltage VPASS by adjusting the voltage value, etc. of the voltage VMREGSUP. The driver 16 outputs the generated voltage VPASS to the row decoder module 15. The voltage VPASS is a voltage to be applied to the non-selected word lines WLu in the program operation of the write operation. The voltage VPASS is a voltage that causes the memory cell transistor MT to be turned on regardless of data stored in the memory cell transistor MT.

The boosting circuit 17B includes, for example, a plurality of charge pumps P11 and P12. The charge pumps P11 and P12 sequentially boost the input voltage input to the charge pump P11, and output the boosted voltage VMREGSUP from the output terminal Tb. Herein, two charge pumps coupled in series are shown; however, a given number of charge pumps may be provided as needed.

1. 1. 3 Structure of Semiconductor Memory Device 1

Hereinafter, a description will be given of an example of a structure of the semiconductor memory device 1 according to the first embodiment.

1. 1. 3. 1 Cross-Sectional Structure of Memory Cell Array

FIG. 8 is a cross-sectional view of a memory cell transistor in the memory cell array 10 included in the semiconductor memory device 1. In FIG. 8, two directions that are orthogonal to each other and parallel to the plane of a semiconductor substrate 30 are referred to as an "X direction" and a "Y direction", and a direction that is orthogonal to a plane (XY plane) including the X and Y directions is referred to as a "Z direction". The X direction corresponds to a direction in which the word lines WL extend, the Y direction corresponds to a direction in which the bit lines BL extend, and the Z direction corresponds to a direction in which the word lines WL are stacked. In FIG. 8, interlayer insulating layers between the conductive layers are omitted.

As shown in FIG. 8, the memory cell array 10 includes conductive layers 31 to 34 provided above the semiconductor substrate 30, a memory pillar MP, and a contact plug CP1. More specifically, the conductive layer 31 is provided above the semiconductor substrate 30. The conductive layer 31 is formed in a plate shape that is parallel to the main surface (or an XY plane) of the semiconductor substrate 30. The conductive layer 31 functions as a source line SL. The conductive layer 31 contains, for example, polysilicon doped with impurities, or tungsten (W).

On the conductive layer 31, a plurality of slits SLT along an XZ plane are aligned in the Y direction. A structure (or layer stack) between adjacent slits SLT on the conductive layer 31 corresponds to, for example, a single string unit SU.

The conductive layer 32, the conductive layers 33, the conductive layer 34, and a conductive layer 35 are provided, in order from the lower layer, between adjacent slits SLT on the conductive layer 31. Of these conductive layers, adjacent conductive layers in the Z direction are stacked via an interlayer insulating film. Each of the conductive layers 32 to 34 is formed in a plane shape that is parallel to the XY plane. The conductive layer 32 functions as a select gate line SGS. The conductive layers 33 respectively function as, in order from the lower layer, word lines WL0 to WL7. The conductive layer 34 functions as a select gate line SGD0. The conductive layers 32 to 34 contain, for example, tungsten (W) or polysilicon.

The memory pillars MP are arranged in, for example, a staggered manner in the X and Y directions. Each of the memory pillars MP extends (or penetrates) the layer stack between the slits SLT in the Z direction. Each memory pillar MP is provided to pass through the conductive layers 34, 33, and 32 from above the conductive layer 34 to reach an upper surface of the conductive layer 31. Each memory pillar MP functions as a single NAND string NS.

The memory pillar MP includes, for example, a block insulating layer 40, a charge storage layer 41, a tunnel insulating layer (also referred to as a "tunnel insulating film") 42, and a semiconductor layer 43. Specifically, the block insulating layer 40 is provided on an inner wall of a memory hole for forming the memory pillar MP. The charge storage layer 41 is provided on an inner wall of the block insulating layer 40. The tunnel insulating layer 42 is provided on an inner wall of the charge storage layer 41. Furthermore, the semiconductor layer 43 is provided on the inside of the tunnel insulating layer 42. The memory pillar MP may have a structure in which a core insulating layer is provided inside the semiconductor layer 43.

In such a configuration of the memory pillar MP, a portion at which the memory pillar MP and the conductive layer 32 intersect functions as a select transistor ST2. The portions at which the memory pillar MP and the conductive layer 33 intersect function as memory cell transistors MT0 to MT7. Furthermore, the portion at which the memory pillar MP and the conductive layer 34 intersect function as a select transistor ST1.

The semiconductor layer 43 functions as a channel layer of the memory cell transistor MT, and the select transistors ST1 and ST2. A current path of the NAND string NS is formed inside the semiconductor layer 43.

The charge storage layer 41 has a function of storing charge injected from the semiconductor layer 43 in the memory cell transistor MT. The charge storage layer 41 includes, for example, a silicon nitride film.

The tunnel insulating layer 42 functions as a potential barrier when charge is injected from the semiconductor layer 43 into the charge storage layer 41, or when the charge stored in the charge storage layer 41 is diffused into the semiconductor layer 43. The tunnel insulating layer 42 includes, for example, a silicon oxide film.

The block insulating layer 40 prevents the charge stored in the charge storage layer 41 from being diffused into the conductive layers 33 (word lines WL). The block insulating layer 40 includes, for example, a silicon oxide layer and a silicon nitride layer.

A plurality of conductive layers 35 are provided via an interlayer insulating film above an upper surface of the memory pillar MP. The conductive layers 35 are aligned in the X direction. Each conductive layer 35 is a linear interconnect layer extending in the Y direction, and functions as a bit line BL. Each conductive layer 35 is electrically coupled to a single memory pillar MP corresponding to each string unit SU. Specifically, in each string unit SU, a contact plug CP1 is provided on the semiconductor layer 43 in each memory pillar MP, and a single conductive layer 35 is provided on the contact plug CP1. The conductive layer 35 contains, for example, aluminum (Al) or tungsten (W). The contact plug CP1 includes a conductive layer of, for example, tungsten (W).

The numbers of the word lines WL and the select gate lines SGD and SGS may be varied according to the numbers of the memory cell transistors MT and the select transistors ST1 and ST2.

1. 2 Operation of Semiconductor Memory Device 1

Hereinafter, a description will be given of the write operation in the semiconductor memory device 1 according to the first embodiment. The write operation includes the program operation and the program verify operation.

The program operation is an operation of applying the write voltage VPGM to a gate electrode of a memory cell transistor MT, thereby injecting charge into a charge storage layer of the memory cell transistor MT and raising a threshold voltage of the memory cell transistor.

The program verify operation is an operation of determining whether or not the threshold voltage of the memory cell transistor MT generated by the application of the write voltage has reached a target voltage. When the threshold voltage of the memory cell transistor MT has reached the target voltage, the determination is referred to as having been "passed", and when the target voltage has not been reached, the determination is referred to as having been "failed".

In the program verify operation, for example, a program verify voltage VPV is applied to a selected word line WLs, and a voltage VREAD is applied to non-selected word lines WLu. For example, a single word line corresponds to the selected word line WLs, and several hundreds of word lines correspond to the non-selected word lines WLu. In this manner, the number of non-selected word lines WLu whose voltage should be boosted to the voltage VREAD is far greater than the number of the selected word lines WLs. Thus, the amount of current to be supplied to the non-selected word lines WLu during the program verify operation is far greater than the amount of current to be supplied to the selected word line WLs.

A write loop consisting of the program operation and the program verify operation is repeated until the determination in the program verify operation is passed. Every time the write loop is repeated, the voltage value of the write voltage VPGM is stepped up. That is, every time the write loop is repeated, the write voltage VPGM is set to be higher than the previous one by a voltage ΔV.

FIG. 9 is a diagram showing a voltage waveform in the write operation according to the first embodiment. FIG. 9(a) shows voltages generated by the boosting circuits 17A and 17B in the program operation and the program verify operation. Specifically, the voltage waveforms shown in FIG. 9(a) show voltages of output terminals Ta and Tb of the boosting circuits 17A and 17B. In FIG. 9 (a) and the drawings subsequent thereto, a voltage waveform VTa shows a voltage supplied to the output terminal Ta of the boosting circuit 17A, and a voltage waveform VTb shows a voltage supplied to the output terminal Tb of the boosting circuit 17B.

FIG. 9(b) shows voltages applied to the word lines WL in the program operation and the program verify operation. Specifically, the voltage waveforms shown in FIG. 9(b) show voltages of the selected word line WLs and the non-selected word lines WLu in the memory cell array 10 in the program operation and the program verify operation. In FIG. 9 (b) and the drawings subsequent thereto, a voltage waveform VWLs denotes a voltage of the selected word line WLs, and a voltage waveform VWLu denotes voltages of the non-selected word lines WLu.

Herein, an example is shown in which the program operation and the program verify operation are repeated twice continuously, namely, a program operation PR1, a program verify operation PV1, a program operation PR2, and a program verify operation PV2 are performed in order continuously.

Hereinafter, a description will be given of voltages of the selected word line and the non-selected word lines in the memory cell array 10 during the program operation and the program verify operation with reference to FIG. 9 (b). The row decoder RDn applies the voltages shown in FIG. 9(b) to the selected word line WLs and the non-selected word lines WLu.

First, the program operation PR1 is performed. At time t1, the row decoder RDn sets the voltages of the selected word line WLs and the non-selected word lines WLu to a voltage VSS (e.g., a reference voltage, a ground voltage, or 0 V). Herein, they are set to the voltage VSS; however, they may be set to a voltage other than the voltage VSS. Similarly, in the description that follows, a voltage set to the voltage VSS may be a voltage other than the voltage VSS.

Subsequently, from time t2 to time t3, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. That is, the voltage VWLs of the selected word line WLs is boosted from the voltage VSS and set to the write voltage VPGM. The voltages VWLu of the non-selected word lines WLu are boosted from the voltage VSS and set to the voltage VPASS.

Thereafter, when the program operation using the write voltage VPGM ends, from time t3 to time t4, the row decoder RDn decreases the voltage VWLs of the selected word line WLs from the write voltage VPGM to the voltage VSS. Also, the row decoder RDn decreases the voltages VWLu of the non-selected word lines WLu from the voltage VPASS to the voltage VSS. That is, the voltage VWLs of the selected word line WLs is dropped from the write voltage VPGM and set to the voltage VSS. The voltages VWLu of the non-selected word lines WLu is dropped from the voltage VPASS and set to the voltage VSS.

Subsequently, the program verify operation PV1 is performed. From time t4 to time t6, the row decoder RDn raises the voltage VWLs of the selected word line WLs from the voltage VSS to the program verify voltage VPV. Also, the row decoder RDn raises the voltages VWLu of the non-selected word lines WLu from the voltage VSS to the voltage VREAD. That is, from time t4 to time t6, the voltage VWLs of the selected word line WLs is boosted from the voltage VSS and set to the program verify voltage VPV. The voltages VWLu of the non-selected word lines WLu is boosted from the voltage VSS and set to the voltage VREAD. The program verify voltage VPV is supplied from a boosting circuit (not illustrated) other than the boosting circuits 17A and 17B.

Thereafter, when the verify operation using the program verify voltage VPV ends, from time t6 to time t7, the row decoder RDn decreases the voltage VWLs of the selected word line WLs from the program verify voltage VPV to the voltage VSS. Also, the row decoder RDn decreases the voltages VWLu of the non-selected word lines WLu from the voltage VREAD to the voltage VSS. That is, from time t6 to time t7, the voltage VWLs of the selected word line WLs is dropped from the program verify voltage VPV and set to the voltage VSS. The voltages VWLu of the non-selected word lines WLu are dropped from the voltage VREAD and set to the voltage VSS.

Subsequently, the program operation PR2 is performed. From time t8 to time t9, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. That is, from time t8 to time t9, the voltage VWLs of the selected word line WLs is boosted from the voltage VSS and set to the write voltage VPGM. The voltages VWLu of the non-selected word lines WLu are boosted from the voltage VSS and set to the voltage VPASS.

Thereafter, when the program operation using the write voltage VPGM ends, from time t9 to time t11, the row decoder RDn decreases the voltage VWLs of the selected word line WLs from the write voltage VPGM to the voltage VSS. Also, the row decoder RDn decreases the voltages VWLu of the non-selected word lines WLu from the voltage VPASS to the voltage VSS. That is, the voltage VWLs of the selected word line WLs is dropped from the write voltage VPGM and set to the voltage VSS. The voltages VWLu of the non-selected word lines WLu are dropped from the voltage VPASS and set to the voltage VSS.

Subsequently, the program verify operation PV2 is performed. From time t11 to time t13, the row decoder RDn raises the voltage VWLs of the selected word line WLs from the voltage VSS to the program verify voltage VPV. Also, the row decoder RDn raises the voltages VWLu of the non-selected word lines WLu from the voltage VSS to the voltage VREAD. That is, from time t11 to time t13, the voltage VWLs of the selected word line WLs is boosted from the voltage VSS and set to the program verify voltage VPV. The voltages VWLu of the non-selected word lines WLu are boosted from the voltage VSS and set to the voltage VREAD.

Thereafter, when the verify operation using the program verify voltage VPV ends, from time t13 to time t14, the row decoder RDn decreases the voltage VWLs of the selected word line WLs from the program verify voltage VPV to the voltage VSS. Also, the row decoder RDn decreases the voltages VWLu of the non-selected word lines WLu from the voltage VREAD to the voltage VSS. That is, from time t13 to time t14, the voltage VWLs of the selected word line WLs is dropped from the program verify voltage VPV and set to the voltage VSS. The voltages VWLu of the non-selected word lines WLu are dropped from the voltage VREAD and set to the voltage VSS.

Next, a description will be given of voltages of output terminals Ta and Tb of the boosting circuits 17A and 17B with reference to FIG. 9(a).

First, the voltages of the output terminals during execution of the program operation PR1 are set as follows. At time t1, the boosting circuits 17A and 17B respectively set a voltage VTa of the output terminal Ta and a voltage VTb of the output terminal Tb to the voltage VSS. That is, the voltage VSS is supplied to the output terminals Ta and Tb. Herein, they are set to the voltage VSS; however, they may be set to a voltage other than the voltage VSS. Similarly, in the description that follows, a voltage set to the voltage VSS may be a voltage other than the voltage VSS.

Subsequently, from time t1 to time t2, the boosting circuit 17A raises the voltage VTa of the output terminal Ta from the voltage VSS to a voltage V1 slightly lower than the voltage VPGMH. The boosting circuit 17B sets the voltage VTb of the output terminal Tb to a voltage VSS. That is, the voltage V1 is supplied to the output terminal Ta. Furthermore, the voltage VSS is supplied to the output terminal Tb.

Subsequently, from time t2 to time t3, the boosting circuit 17A raises the voltage VTa of the output terminal Ta from the voltage V1 to the voltage VPGMH. The boosting circuit 17B raises the voltage VTb of the output terminal Tb from the voltage VSS to the voltage VMREGSUP. That is, the voltage VPGMH is supplied to the output terminal Ta. Furthermore, the voltage VMREGSUP is supplied to the output terminal Tb. Herein, a case is shown where the voltage VMREGSUP is lower than the voltage VPGMH; however, the voltage VMREGSUP may be higher than the voltage VPGMH.

When the program operation using the write voltage VPGM ends, from time t3 to time t4, the boosting circuit 17A decreases the voltage VTa of the output terminal Ta from the voltage VPGMH to a reset voltage VX1 or a voltage close to the reset voltage VX1. The boosting circuit 17B decreases the voltage VTb of the output terminal Tb from the voltage VMREGSUP to a reset voltage VEXT. That is, the reset voltage VX1 is supplied to the output terminal Ta. The reset voltage VEXT is supplied to the output terminal Tb. Specifically, the voltage VTa of the output terminal Ta is discharged and decreased from the voltage VPGMH to the reset voltage VX1 or a voltage close to the reset voltage VX1. Furthermore, the voltage VTb of the output terminal Tb is discharged and decreased from the voltage VMREGSUP to the reset voltage VEXT.

The voltage VSS, for example, may be used as the reset voltages VX1 and VEXT. The reset voltage VX1 may be any voltage that is sufficiently lower than the withstand voltage of the transistor in the boosting circuit 17A, and need not be the voltage VSS. By discharging the voltage VPGMH of the output terminal Ta of the boosting circuit 17A to a sufficiently low reset voltage VX1, it is possible to prevent the transistor in the boosting circuit 17A from breaking down after the withstand voltage is exceeded. The reset voltage VX1 and the reset voltage VEXT may take different voltage values, or the same voltage value.

Subsequently, the voltages of the output terminals during execution of the program verify operation PV1 are set as follows. From time t4 to time t5, the boosting circuit 17A raises the voltage VTa of the output terminal Ta from the reset voltage VX1 to the voltage VMREGSUP, as shown by S1 in FIG. 9 (a). That is, the voltage VMREGSUP is supplied to the output terminal Ta. The voltage VMREGSUP of the output terminal Ta is supplied to the driver 16. The driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases. This helps the voltages of the non-selected word lines WLu to rise from the voltage VSS to the voltage VREAD. That is, an increase in the amount of current supplied from the driver 16 to the non-selected word lines WLu helps boost the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WL to arrive at the voltage VREAD from the voltage VSS is shortened.

Similarly, from time t4 to time t5, the boosting circuit 17B raises the voltage VTb of the output terminal Tb from the reset voltage VEXT to the voltage VMREGSUP, as shown by S1 in FIG. 9(a). That is, the voltage VMREGSUP is supplied to the output terminal Tb. The voltage VMREGSUP of the output terminal Tb is supplied to the driver 16. The driver 16 generates a voltage VREAD from the supplied voltage VMREGSUP. The driver 16 supplies the generated voltage VREAD to the non-selected word lines WLu via the row decoder module 15. The boosting circuit 17B is a circuit that mainly supplies the voltage VMREGSUP to the driver 16.

As described above, from time t4 to time t5, the voltage VMREGSUP is supplied from two circuits, namely, the boosting circuits 17A and 17B, to the driver 16. Originally, it was mainly the boosting circuit 17B that supplied the voltage VMREGSUP to the driver 16; in the present embodiment, however, the boosting circuit 17A also supplies the voltage VMREGSUP to the driver 16. That is, in addition to the voltage VMREGSUP supplied mainly from the boosting circuit 17B to the driver 16, the voltage VMREGSUP is also supplied subsidiarily from the boosting circuit 17A to the driver 16. Since the voltage VMREGSUP is supplied to the driver 16 from the boosting circuits 17A and 17B, the amount of current supplied from the driver 16 to the non-selected word lines WLu increases, thus accelerating boosting of the voltages of the non-selected word lines WLu from the voltage VSS to the voltage VREAD. This reduces the time taken for the voltages of the non-selected word lines to reach the voltage VREAD. As a result, the time for the program verify operation PV1 is shortened.

Subsequently, from time t5 to time t7, the boosting circuit 17A raises the voltage VTa of the output terminal Ta from the voltage VMREGSUP to a voltage V1. That is, from time t5 to time t7, the voltage V1 is supplied to the output terminal Ta. The voltage of the output terminal Ta is not supplied to the word line from time t5 to time t7. However, the voltage of the output terminal Ta is boosted to the voltage V1 in preparation for the next program operation PR2.

Also, from time t5 to time t6, the boosting circuit 17B maintains the voltage VTb of the output terminal Tb at the voltage VMREGSUP. That is, from time t5 to time t6, the voltage VMREGSUP is supplied to the output terminal Tb.

Thereafter, when the verify operation using the program verify voltage VPV ends, from time t6 to time t7, the boosting circuit 17B decreases the voltage VTb of the output terminal Tb from the voltage VMREGSUP to the reset voltage VEXT. That is, from time t6 to time t7, the reset voltage VEXT is supplied to the output terminal Tb.

Subsequently, the voltages of the output terminals before the program operation PR2 is started and during execution of the program operation PR2 are set as follows. From time t7 to time t8, the boosting circuit 17A maintains the voltage VTa of the output terminal Ta at the voltage V1. The boosting circuit 17B maintains the voltage of the output terminal Tb at the reset voltage VEXT. That is, from time t7 to time t8, the voltage V1 is supplied to the output terminal Ta. Furthermore, the reset voltage VEXT is supplied to the output terminal Tb.

Subsequently, from time t8 to time t9, the boosting circuit 17A raises the voltage VTa of the output terminal. Ta from the voltage V1 to the voltage VPGMH. The boosting circuit 17B raises the voltage VTb of the output terminal Tb from the reset voltage VEXT to the voltage VMREGSUP. That is, the voltage VPGMH is supplied to the output terminal Ta. Furthermore, the voltage VMREGSUP is supplied to the output terminal Tb.

When the program operation using the write voltage VPGM ends, from time t9 to time t10, the boosting circuit 17A decreases the voltage VTa of the output terminal Ta from the voltage VPGMH to the voltage V1. The boosting circuit 17B decreases the voltage VTb of the output terminal Tb from the voltage VMREGSUP to the reset voltage VEXT. That is, the voltage V1 is supplied to the output terminal Ta. Furthermore, the reset voltage VEXT is supplied to the output terminal Tb. Specifically, a voltage higher than the write voltage VPGM used in the program operation PR1 by $\Delta V$, for example, is used as the write voltage in the program operation PR2. Similarly, a voltage higher by $\Delta V$ is used as the voltage VPGMH.

Thereafter, from time t10 to time t11, the boosting circuit 17A decreases the voltage VTa of the output terminal Ta from the voltage V1 to a reset voltage VX1 or a voltage close to the reset voltage VX1. The boosting circuit 17B maintains the voltage VTb of the output terminal Tb at the reset voltage VEXT. That is, the reset voltage VX1 is supplied to the output terminal Ta. The reset voltage VEXT is supplied to the output terminal Tb. Specifically, the voltage VTa of the output terminal Ta is discharged and decreased from the voltage V1 to the reset voltage VX1 or a voltage close to the reset voltage VX1. Furthermore, the voltage VTb of the output terminal Tb is maintained at the reset voltage VEXT. By discharging the voltage VPGMH of the output terminal Ta of the boosting circuit 17A to a sufficiently low reset voltage VX1, it is possible to prevent the transistor in the boosting circuit 17A from breaking down after the withstand voltage is exceeded.

Subsequently, the voltages of the output terminals during execution of the program verify operation PV2 are set as follows. From time t11 to time t12, the boosting circuit 17A raises the voltage VTa of the output terminal Ta from the reset voltage VX1 to the voltage VMREGSUP, as shown by S2 in FIG. 9(a). That is, the voltage VMREGSUP is supplied to the output terminal Ta. The voltage VMREGSUP of the output terminal Ta is supplied to the driver 16. The driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases. This helps the voltages of the non-selected word lines WLu to rise from the voltage VSS to the voltage VREAD. That is, an increase in the amount of current supplied from the driver 16 to the non-selected word lines WLu helps boost the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WL to arrive at the voltage VREAD from the voltage VSS is shortened.

Similarly, from time t11 to time t12, the boosting circuit 17B raises the voltage VTb of the output terminal Tb from the reset voltage VEXT to the voltage VMREGSUP. That is, the voltage VMREGSUP is supplied to the output terminal Tb. The voltage VMREGSUP of the output terminal Tb is supplied to the driver 16. The driver 16 generates the voltage VREAD from the supplied voltage VMREGSUP. The driver 16 supplies the generated voltage VREAD to the non-selected word lines WLu via the row decoder module 15.

As described above, from time t11 to time t12, the voltage VMREGSUP is supplied from two circuits, namely, the boosting circuits 17A and 17B, to the driver 16. Originally, it was mainly the boosting circuit 17B that supplied the voltage VMREGSUP to the driver 16; in the present embodiment, however, the boosting circuit 17A also supplies the voltage VMREGSUP to the driver 16. That is, in addition to the voltage VMREGSUP supplied mainly from the boosting circuit 17B to the driver 16, the voltage VMREGSUP is also supplied subsidiarily from the boosting circuit 17A to the driver 16. Since the voltage VMREGSUP is supplied to the driver 16 from the boosting circuits 17A and 17B, the amount of current supplied from the driver 16 to the non-selected word lines WLu increases, thus accelerating boosting of the voltages of the non-selected word lines WLu from the voltage VSS to the voltage VREAD. This reduces the time taken for the voltages of the non-selected word lines WLu to reach the voltage VREAD. As a result, the time for the program verify operation PV2 is shortened.

Subsequently, from time t12 to time t14, the boosting circuit 17A raises the voltage VTa of the output terminal Ta from the voltage VMREGSUP to the voltage V1. That is, from time t12 to time t14, the voltage V1 is supplied to the output terminal Ta. The voltage of the output terminal Ta is not supplied to the word line from time t12 to time t14. However, the output terminal Ta is boosted to the voltage V1 in preparation for the next program operation.

Also, from time t12 to time t13, the boosting circuit 17B maintains the voltage VTb of the output terminal Tb at the voltage VMREGSUP. That is, from time t12 to time t13, the voltage VMREGSUP is supplied to the output terminal Tb.

Thereafter, when the verify operation using the program verify voltage VPV ends, from time t13 to time t14, the boosting circuit 17B decreases the voltage VTb of the output terminal Tb from the voltage VMREGSUP to the reset voltage VEXT. That is, from time t13 to time t14, the reset voltage VEXT is supplied to the output terminal Tb. This is the end of the write operation shown in FIG. 9.

1. 3 Modifications of First Embodiment

Hereinafter, a description will be given of write operations according to first and second modifications of the first embodiment.

1. 3. 1 First Modification

In the write operation according to the first embodiment shown in FIG. 9, after the voltage VPGMH of the output terminal Ta of the boosting circuit 17A is discharged, the voltage VMREGSUP is supplied from the boosting circuit 17A to the driver 16 during the period from time t4 to time t5, helping boosting of the voltages of the non-selected word lines WLu to the voltage VREAD. In the first modification, the boosting circuit 17A helps boosting of another operation voltage during the first half of time t4 to time t5, and the boosting circuit 17A supplies the voltage VMREGSUP to the driver 16 during the second half of time t4 to time t5 to help boosting of the voltages of the non-selected word lines WLu to the voltage VREAD. In the first modification, mainly differences from the first embodiment will be described. The structures and operations that are not described are the same as those of the first embodiment.

Figure 10:
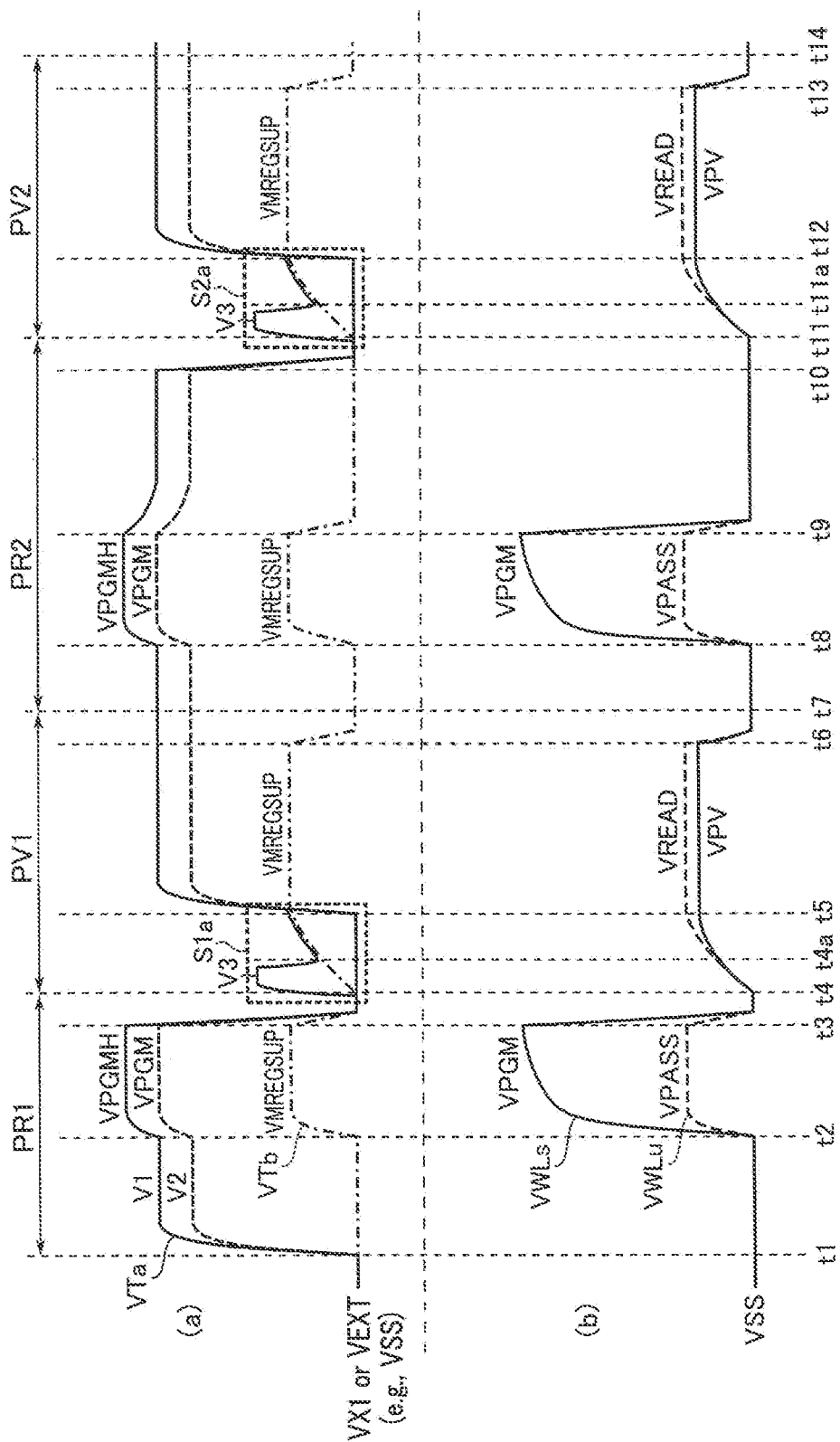
FIG. 10 is a diagram showing a voltage waveform in a write operation according to a first modification of the first embodiment.

FIG. 10 is a diagram showing a voltage waveform in the write operation according to the first modification. FIG. 10 (a) shows the voltage VTa of the boosting circuit 17A and the voltage VTb of the boosting circuit 17B in the program operation and the program verify operation.

The first modification differs from the write operation shown in FIG. 9 in terms of the operation in the period from time t4 to time t5, namely, the period shown by S1a, and the operation in the period from time t11 to time t12, namely, the period shown by S2a.

From time t4 to time t4a, the boosting circuit 17A raises the voltage VTa of the output terminal Ta from the reset voltage VX1 to a voltage V3. Here, the output terminal Ta is electrically coupled to a signal line to be voltage-boosted, and the voltage V3 is supplied from the output terminal Ta to the signal line to be voltage-boosted. This helps the voltage of the signal line to be boosted from the voltage VSS to the voltage V3. For example, the signal line to be voltage-boosted is coupled to a gate of a transfer gate that transfers a predetermined voltage. The voltage V3 is supplied to the gate of the transfer gate.

After that, from time t4a to time t5, the boosting circuit 17A decreases the voltage VTa of the output terminal Ta from the voltage V3 to the voltage VMREGSUP. Here, the output terminal Ta is electrically coupled to the driver 16, and the driver 16 is electrically coupled to the non-selected word lines WLu. Thus, the voltage VMREGSUP of the output terminal Ta is supplied to the driver 16, and the driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases, thus helping boosting of the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WL to arrive at the voltage VREAD from the voltage VSS is shortened.

Similarly, from time t11 to time t11a, the boosting circuit 17A raises the voltage VTa of the output terminal Ta from the reset voltage VX1 to the voltage V3. Here, the output terminal Ta is electrically coupled to the signal line to be voltage-boosted, and the voltage V3 is supplied from the output terminal Ta to the signal line to be voltage-boosted. This helps the voltage of the signal line to be boosted from the voltage VSS to the voltage V3.

After that, from time t11a to time t12, the boosting circuit 17A decreases the voltage VTa of the output terminal Ta from the voltage V3 to the voltage VMREGSUP. Here, the output terminal Ta is electrically coupled to the driver 16, and the driver 16 is electrically coupled to the non-selected word lines WLu. Thus, the voltage VMREGSUP of the output terminal Ta is supplied to the driver 16, and the driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases, thus helping boosting of the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WL to arrive at the voltage VREAD from the voltage VSS is shortened.

By using the boosting circuit 17A originally designed to supply the voltage VPGMH (and the write voltage VPGM) to supply the voltage VMREGSUP and the voltage V3, the boosting circuit 17A can be efficiently used.

In the first modification, boosting of operation voltages other than the voltages of the non-selected word lines WLu is helped in the first half of the period denoted by S1a and S2a; however, boosting of no operation voltages may be helped in the first half of the period and boosting of the voltages of the non-selected word lines WLu to the voltage VREAD may be helped only in the second half of the period.

1. 3. 2 Second Modification

In the second modification, an operation of raising the voltages of the selected word line WLs and the non-selected word lines WLu to a voltage VCP immediately before raising the voltage of the selected word line WLs to the write voltage VPGM is added to the write operation shown in FIG. 9. In the second modification, mainly differences from the first embodiment will be described. The structures and operations that are not described are the same as those of the first embodiment.

Figure 11:
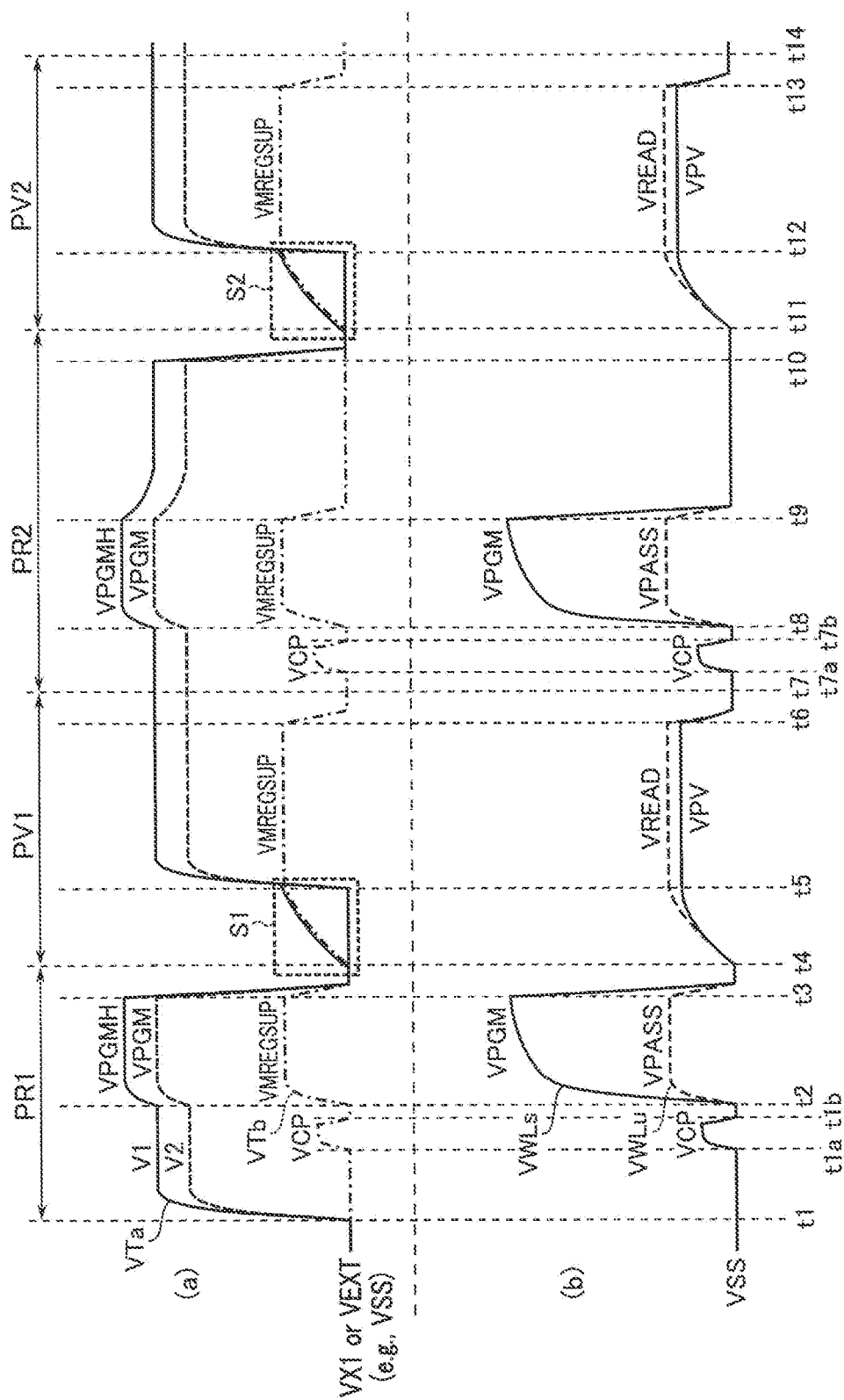
FIG. 11 is a diagram showing a voltage waveform in a write operation according to a second modification of the first embodiment.

FIG. 11 is a diagram showing a voltage waveform in the write operation according to the second modification. FIG. 11(b) shows voltages of the selected word line and the non-selected word lines in the memory cell array 10 during the program operation and the program verify operation. Hereinafter, a description will be given of voltages of the selected word line and the non-selected word lines in the memory cell array 10.

From time t1a to time t1b of the program operation PR1, the row decoder RDn raises the voltage VWLs of the selected word line WLs from the voltage VSS to the voltage VCP, and then decreases it from the voltage VCP to the voltage VSS. Similarly, the row decoder RDn raises the voltages VWLu of the non-selected word lines WLu from the voltage VSS to the voltage VCP, and then decreases it from the voltage VCP to the voltage VSS. That is, from time t1a to time t1b, the voltages of the selected word line WLs and the non-selected word lines WLu are boosted from the voltage VSS to the voltage VCP, and then dropped from the voltage VCP to the voltage VSS.

Similarly, from time t7a to time t7b of the program operation PR2, the row decoder RDn raises the voltage VWLs of the selected word line WLs and the voltages VWLu of the non-selected word lines WLu from the voltage VSS to the voltage VCP, and then decreases it from the voltage VCP to the voltage VSS. That is, from time t7a to time t7b, the voltages of the selected word line WLs and the non-selected word lines WLu are boosted from the voltage VSS to the voltage VCP, and then dropped from the voltage VCP to the voltage VSS.

FIG. 11(a) shows voltages of the output terminals Ta and Tb of the boosting circuits 17A and 17B in the program operation and the program verify operation. Hereinafter, a description will be given of voltages of the output terminals Ta and Tb of the boosting circuits 17A and 17B with reference to FIG. 11(a).

From time t1a to time t1b of the program operation PR1, the boosting circuit 17B raises the voltage VTb of the output terminal Tb from the voltage VSS to the voltage VCP, and then decreases the voltage VCP to the voltage VSS. That is, the voltage VCP is supplied to the output terminal Tb, and then the voltage VSS is supplied. The voltage of the output terminal Ta is similar to the voltage shown in FIG. 9(a).

Similarly, from time t7a to time t7b of the program operation PR2, the boosting circuit 17B raises the voltage VTb of the output terminal Tb from the voltage VSS to the voltage VCP, and then decreases the voltage VCP to the voltage VSS. That is, the voltage VCP is supplied to the output terminal Tb, and then the voltage VSS is supplied. The voltage of the output terminal Ta is similar to the voltage shown in FIG. 9 (a).

In the second modification, by raising the voltages of the selected word line WLs and the non-selected word lines WLu to the voltage VCP immediately before raising the voltage of the selected word line WLs to the write voltage VPGM, as described above, a channel region of the memory cell transistor MT is precharged. That is, in the second modification, the voltage of the channel region of the memory cell transistor MT is raised prior to execution of the program operation. It is thereby possible to speed up the write operation, thus shortening the write period required for the write operation.

1. 4 Advantageous Effects

According to the first embodiment, it is possible to provide a semiconductor memory device capable of speeding up the write operation. That is, in the semiconductor memory device of the first embodiment, the write time required in the write operation can be shortened.

Hereinafter, a description will be given of a comparative example of the first embodiment, and advantageous effects of the first embodiment will be described.

A voltage generation circuit included in the semiconductor memory device of the comparative example includes, for example, a first boosting circuit for generating a high voltage and a second boosting circuit for generating an intermediate voltage. The first boosting circuit is a circuit for generating the high voltage, and generates, for example, the voltage VPGMH higher than the write voltage VPGM used in the program operation of the write operation. The second boosting circuit is a circuit for generating the intermediate voltage lower than the high voltage, and supplies, for example, the voltage VMREGSUP to a driver that generates the voltage VREAD and the voltage VPASS.

FIG. 12 is a diagram showing a voltage waveform in the write operation of the semiconductor memory device according to the comparative example. In a program verify operation PV11, a voltage Va of an output terminal of the first boosting circuit is maintained at a voltage V1 lower than the voltage VPGMH, as shown in FIG. 12. In the program verify operation PV11, the voltage V1 generated by the first boosting circuit is not supplied to any of the signal lines, and is maintained at the voltage V1 in preparation for the next program operation.

In the present embodiment, the boosting circuit 17A generates the voltage VPGMH to the output terminal Ta during the program operation PR1, and generates the reset voltage VX1 to the output terminal Ta at the end of the program operation PR1. Furthermore, the boosting circuit 17A generates the voltage VMREGSUP to the output terminal Ta during the program verify operation PV1, and then generates the voltage V1 to the output terminal Ta. That is, the boosting circuit 17A raises the voltage of the output terminal Ta to the voltage VPGMH during the program operation PR1, and decreases the voltage of the output terminal Ta from the voltage VPGMH to the reset voltage VX1 at the end of the program operation PR1. Furthermore, the boosting circuit 17A raises the voltage of the output terminal Ta from the reset voltage VX1 to the voltage VMREGSUP at the start of the program verify operation PV1, and then raises the voltage of the output terminal Ta from the voltage VMREGSUP to the voltage V1.

In the program verify operations PV1 and PV2, not only is the voltage VMREGSUP generated by the boosting circuit 17B supplied to the driver 16, the voltage VMREGSUP is generated by the boosting circuit 17A and the generated voltage VMREGSUP is supplied to the driver 16. By the boosting circuit 17A supplying the voltage VMREGSUP to the driver 16, the amount of current supplied from the driver 16 to the non-selected word lines WLu increases, thus helping boosting of the voltages of the non-selected word lines WLu from the voltage VSS to the voltage VREAD.

The above-described operation accelerates the voltages of the non-selected word lines WLu arriving at the voltage VREAD from the voltage VSS. In other words, the time taken for the voltages of the non-selected word lines WLu to arrive at the voltage VREAD from the voltage VSS is shortened. By shortening the time for the non-selected word lines WLu to arrive at the voltage VREAD, the time for the program verify operations PV1 and PV2 can be reduced. It is thereby possible to speed up the write operation.

As described above, with the semiconductor memory device of the first embodiment, it is possible to speed up the write operation. That is, the write time required in the write operation can be shortened.

2. Second Embodiment

Hereinafter, a description will be given of a semiconductor memory device according to a second embodiment. In the first embodiment, the example has been described in which the program verify operation is performed after the program operation. In the second embodiment, an example will be described in which the program verify operation is performed continuously. In the second embodiment, mainly differences from the first embodiment will be described. The structures and operations that are not described are the same as those of the first embodiment.

2. 1 Operation of Semiconductor Memory Device 1

A write operation according to a first example and a second example will be described with respect to the case where a second program verify operation is performed continuously after a first program verify operation in the write operation.

The first example is the case where both the voltage VTa of the boosting circuit 17A and the voltage VTb of the boosting circuit 17B are dropped and set to the voltage VSS during the period between the first program verify operation and the second program verify operation. The first example is an operation of allowing the program operation to be performed without delay, taking into account the possibility that the program operation may be performed immediately after the first program verify operation.

The second example is the case where the voltage VTa of the boosting circuit 17A is maintained at the voltage V1, and the voltage VTb of the boosting circuit 17B is maintained at the voltage VMREGSUP during the period between the first program verify operation and the second program verify operation. The second example is an operation when the sequencer 13 knows that the second program verify operation is performed continuously immediately after the first program verify operation. That is, it is an operation when the sequencer 13 knows that the program operation is not performed and the second program verify operation is performed immediately after the first program verify operation.

2. 1. 1 First Example

FIG. 13 is a diagram showing a voltage waveform in the write operation according to the first example of the second embodiment. FIG. 13 (*a*) shows voltages of output terminals Ta and Tb of boosting circuits 17A and 17B in the program operation and the program verify operation. FIG. 13(*b*) shows voltages of the selected word line and the non-selected word lines in the memory cell array 10 in the program operation and the program verify operation.

Herein, an example is shown in which the program verify operation is repeated twice, namely, a program operation PR1, a program verify operation PV1, a program verify operation PV2, and a program operation PR2 are performed in order continuously.

Hereinafter, a description will be given of a voltage VWLs of the selected word line and a voltages VWLu of the non-selected word lines in the memory cell array 10 during the program operation and the program verify operation with reference to FIG. 13(*b*). The row decoder RDn applies the voltages shown in FIG. 13(*b*) to the selected word line WLs and the non-selected word lines WLu.

First, the program operation PR1 is performed. The voltages of the selected word line WLs and the non-selected word lines WLu from time t1 to time t4 are the same as those shown in FIG. 9(*b*). At time t1, the row decoder RDn sets the voltages of the selected word line WLs and the non-selected word lines WLu to the voltage VSS. Subsequently, from time t2 to time t3, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. Thereafter, when the program operation using the write voltage VPGM ends, from time t3 to time t4, the row decoder RDn decreases the voltage of the selected word line WLs from the write voltage VPGM to the voltage VSS. Also, the row decoder RDn decreases the voltages of the non-selected word lines WLu from the voltage VPASS to the voltage VSS.

Subsequently, the program verify operation PV1 is performed. From time t4 to time t22, the row decoder RDn raises the voltage VWLs of the selected word line WLs from the voltage VSS to the program verify voltage VPV1. Also, the row decoder RDn raises the voltages VWLu of the non-selected word lines WLu from the voltage VSS to the voltage VREAD. That is, from time t4 to time t22, the voltage of the selected word line WLs is boosted from the voltage VSS and set to the program verify voltage VPV1. The voltages of the non-selected word lines WLu are boosted from the voltage VSS and set to the voltage VREAD.

Thereafter, when the verify operation using the program verify voltage VPV1 ends, from time t22 to time t23, the row decoder RDn decreases the voltage of the selected word line WLs from the program verify voltage VPV1 to the voltage VSS. Also, the row decoder RDn decreases the voltages of the non-selected word lines WLu from the voltage VREAD to the voltage VSS. That is, from time t22 to time t23, the voltage VWLs of the selected word line WLs is dropped from the program verify voltage VPV1 and set to the voltage VSS. The voltages VWLu of the non-selected word lines WLu are dropped from the voltage VREAD and set to the voltage VSS.

Subsequently, the program verify operation PV2 is performed. From time t23 to time t25, the row decoder RDn raises the voltage VWLs of the selected word line WLs from the voltage VSS to a program verify voltage VPV2. Also, the row decoder RDn raises the voltages VWLu of the non-selected word lines WLu from the voltage VSS to the voltage VREAD. That is, from time t23 to time t25, the voltage VWLs of the selected word line WLs is boosted from the voltage VSS and set to the program verify voltage VPV2. The voltages VWLu of the non-selected word lines WLu are boosted from the voltage VSS and set to the voltage VREAD.

Thereafter, when the verify operation using the program verify voltage VPV2 ends, from time t25 to time t26, the row decoder RDn decreases the voltage VWLs of the selected word line WLs from the program verify voltage VPV2 to the voltage VSS. Also, the row decoder RDn decreases the voltages VWLu of the non-selected word lines WLu from the voltage VREAD to the voltage VSS. That is, from time t25 to time t26, the voltage VWLs of the selected word line WLs is dropped from the program verify voltage VPV2 and set to the voltage VSS. The voltages VWLu of the non-selected word lines WLu are dropped from the voltage VREAD and set to the voltage VSS.

Subsequently, the program operation PR2 is performed. From time t27 to time t28, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. That is, from time t27 to time t28, the voltage VWLs of the selected word line WLs is boosted from the voltage VSS and set to the write voltage VPGM. The voltages VWLu of the non-selected word lines WLu are boosted from the voltage VSS and set to the voltage VPASS.

Thereafter, when the program operation using the write voltage VPGM ends, from time t28 to time t29, the row decoder RDn decreases the voltage VWLs of the selected word line WLs from the write voltage VPGM to the voltage VSS. Also, the row decoder RDn decreases the voltages VWLu of the non-selected word lines WLu from the voltage VPASS to the voltage VSS. That is, the voltage VWLs of the selected word line WLs is dropped from the write voltage VPGM and set to the voltage VSS. The voltages VWLu of the non-selected word lines WLu are dropped from the voltage VPASS and set to the voltage VSS.

Next, a description will be given of the voltage VTa of the output terminal Ta and the voltage VTb of the output terminal Tb of the boosting circuits 17A and 17B with reference to FIG. 13(a).

First, the voltages of the output terminals during execution of the program operation PR1 are set as follows. The voltages of the output terminals Ta and Tb from time t1 to time t4 are similar to the voltages shown in FIG. 9(a). At time t1, the boosting circuits 17A and 17B set the voltages of the output terminals Ta and Tb to the voltage VSS. Subsequently, from time t1 to time t2, the boosting circuit 17A raises the voltage VTa of the output terminal Ta from the voltage VSS to the voltage V1 lower than the voltage VPGMH. The boosting circuit 17B sets the voltage VTb of the output terminal Tb to the voltage VSS. Subsequently, from time t2 to time t3, the boosting circuit 17A raises the voltage of the output terminal Ta from the voltage V1 to the voltage VPGMH. The boosting circuit 17B raises the voltage of the output terminal Tb from the voltage VSS to the voltage VMREGSUP. Thereafter, when the program operation using the write voltage VPGM ends, from time t3 to time t4, the boosting circuit 17A decreases the voltage of the output terminal Ta from the voltage VPGMH to the reset voltage VX1 or a voltage close to the reset voltage VX1. The boosting circuit 17B decreases the voltage of the output terminal Tb from the voltage VMREGSUP to the reset voltage VEXT. Specifically, the voltage of the output terminal Ta is discharged and decreased from the voltage VPGMH to the reset voltage VX1 or a voltage close to the reset voltage VX1. Furthermore, the voltage of the output terminal Tb is discharged and decreased from the voltage VMREGSUP to the reset voltage VEXT. By discharging the voltage VPGMH of the output terminal Ta of the boosting circuit 17A to a sufficiently low reset voltage VX1, it is possible to prevent the transistor in the boosting circuit 17A from breaking down after the withstand voltage is exceeded.

Subsequently, the voltages of the output terminals during execution of the program verify operation PV1 are set as follows. From time t4 to time t21, the boosting circuit 17A raises the voltage VTa of the output terminal Ta from the reset voltage VX1 to the voltage VMREGSUP, as shown by S1 in FIG. 13(a). The voltage VMREGSUP of the output terminal Ta is supplied to the driver 16. The driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases. This helps the voltages of the non-selected word lines WLu to rise from the voltage VSS to the voltage VREAD. That is, an increase in the amount of current supplied from the driver 16 to the non-selected word lines WLu helps boost the voltages of the non-selected word lines WLu from the voltage VSS to the voltage VREAD. This accelerates the voltages of the non-selected word lines WLu arriving at the voltage VREAD from the voltage VSS. In other words, the time taken for the voltages of the non-selected word lines WL to arrive at the voltage VREAD from the voltage VSS is shortened.

Similarly, from time t4 to time t21, the boosting circuit 17B raises the voltage VTb of the output terminal Tb from the reset voltage VEXT to the voltage VMREGSUP, as shown by S1 in FIG. 13(a). The voltage VMREGSUP of the output terminal Tb is supplied to the driver 16. The driver 16 generates the voltage VREAD from the supplied voltage VMREGSUP. The driver 16 supplies the generated voltage VREAD to the non-selected word lines WLu via the row decoder module 15.

As described above, from time t4 to time t21, the voltage VMREGSUP is supplied from two circuits, namely, the boosting circuits 17A and 17B, to the driver 16. Originally, it was mainly the boosting circuit 17B that supplied the voltage VMREGSUP to the driver 16; in the present embodiment, however, the boosting circuit 17A also supplies the voltage VMREGSUP to the driver 16. That is, in addition to the voltage VMREGSUP supplied mainly from the boosting circuit 17B to the driver 16, the voltage VMREGSUP is also supplied subsidiarily from the boosting circuit 17A to the driver 16. Since the voltage VMREGSUP is supplied to the driver 16 from the boosting circuits 17A and 17B, the amount of current supplied from the driver 16 to the non-selected word lines WLu increases, thus accelerating boosting of the voltages of the non-selected word lines WLu from the voltage VSS to the voltage VREAD. This reduces the time taken for the voltages of the non-selected word lines WLu to reach the voltage VREAD. As a result, the time for the program verify operation PV1 is shortened.

Subsequently, from time t21 to time t22, the boosting circuit 17A raises the voltage VTa of the output terminal Ta from the voltage VMREGSUP to a voltage V1. That is, from time t21 to time t22, the voltage V1 is supplied to the output terminal Ta. The voltage of the output terminal Ta is not supplied to the word lines from time t21 to time t22. However, since there is a possibility that the program operation may be performed next, the voltage of the output terminal Ta is boosted to the voltage V1. In this example, since the program verify operation PV2 is performed next, the voltage V1 of the output terminal Ta is discharged again, as will be described later.

Also, from time t21 to time t22, the boosting circuit 17B maintains the voltage VTb of the output terminal Tb at the voltage VMREGSUP. That is, from time t21 to time t22, the voltage VMREGSUP is supplied to the output terminal Tb.

Thereafter, when a verify operation using the program verify voltage VPV1 ends, from time t22 to time t23, the boosting circuit 17A decreases the voltage VTa of the output terminal Ta from the voltage V1 to a reset voltage VX1 or a voltage close to the reset voltage VX1. The boosting circuit 17B decreases the voltage VTb of the output terminal Tb from the voltage VMREGSUP to a reset voltage VEXT. That is, the reset voltage VX1 is supplied to the output terminal Ta. The reset voltage VEXT is supplied to the output terminal Tb. Specifically, the voltage of the output terminal Ta is discharged, and decreased from the voltage V1 to the reset voltage VX1. Furthermore, the voltage of the output terminal Tb is discharged and decreased from the voltage VMREGSUP to the reset voltage VEXT. Since the voltage V1 of the output terminal Ta of the boosting circuit 17A is discharged to a sufficiently low reset voltage VX1, it is possible to prevent the transistor in the boosting circuit 17A from breaking down after the withstand voltage is exceeded.

Subsequently, the voltages of the output terminals during execution of the program verify operation PV2 are set as follows. From time t23 to time t24, the boosting circuit 17A raises the voltage VTa of the output terminal Ta from the reset voltage VX1 to the voltage VMREGSUP, as shown by S2 in FIG. 13(a). The voltage VMREGSUP of the output terminal Ta is supplied to the driver 16. The driver 16 generates a voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases. This helps the voltages of the non-selected word lines WLu to rise from the voltage VSS to the voltage VREAD. That is, an increase in the amount of current supplied from the driver 16 to the non-selected word lines WLu helps boost the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WL to arrive at the voltage VREAD from the voltage VSS is shortened.

Similarly, from time t23 to time t24, the boosting circuit 17B raises the voltage VTb of the output terminal Tb from the reset voltage VEXT to the voltage VMREGSUP. That is, the voltage VMREGSUP is supplied to the output terminal Tb. The voltage VMREGSUP of the output terminal Tb is supplied to the driver 16. The driver 16 generates the voltage VREAD from the supplied voltage VMREGSUP. The driver 16 supplies the generated voltage VREAD to the non-selected word lines WLu via the row decoder module 15.

As described above, from time t23 to time t24, the voltage VMREGSUP is supplied from two circuits, namely, the boosting circuits 17A and 17B, to the driver 16. Originally, it was mainly the boosting circuit 17B that supplied the voltage VMREGSUP to the driver 16; in the present embodiment, however, the boosting circuit 17A also supplies the voltage VMREGSUP to the driver 16. That is, in addition to the voltage VMREGSUP supplied mainly from the boosting circuit 17B to the driver 16, the voltage VMREGSUP is also supplied subsidiarily from the boosting circuit 17A to the driver 16. Since the voltage VMREGSUP is supplied to the driver 16 from the boosting circuits 17A and 17B, the amount of current supplied from the driver 16 to the non-selected word lines WLu increases, thus accelerating boosting of the voltages of the non-selected word lines WLu from the voltage VSS to the voltage VREAD. This reduces the time taken for the voltages of the non-selected word lines WLu to reach the voltage VREAD. As a result, the time for the program verify operation PV2 is shortened.

Subsequently, from time t24 to time t25, the boosting circuit 17A raises the voltage VTa of the output terminal Ta from the voltage VMREGSUP to the voltage V1. That is, from time t24 to time t25, the voltage V1 is supplied to the output terminal Ta. The voltage of the output terminal Ta is not supplied to the word lines from time t24 to time t25. However, the voltage of the output terminal Ta is boosted to the voltage V1 in preparation for the next program operation PR2.

Also, from time t24 to time t25, the boosting circuit 17B maintains the voltage VTb of the output terminal Tb at the voltage VMREGSUP. That is, from time t24 to time t25, the voltage VMREGSUP is supplied to the output terminal Tb.

Thereafter, when the verify operation using the program verify voltage VPV2 ends, from time t25 to time t26, the boosting circuit 17A maintains the voltage VTa of the output terminal Ta at the voltage V1. The boosting circuit 17B decreases the voltage VTb of the output terminal Tb from the voltage VMREGSUP to the reset voltage VEXT. That is, from time t25 to time t26, the voltage V1 is supplied to the output terminal Ta. Furthermore, the reset voltage VEXT is supplied to the output terminal Tb.

Subsequently, the voltages of the output terminals during execution of the program operation PR2 are set as follows. From time t26 to time t27, the boosting circuit 17A maintains the voltage VTa of the output terminal Ta at the voltage V1. The boosting circuit 17B maintains the voltage VTb of the output terminal Tb at the reset voltage VEXT. That is, from time t26 to time t27, the voltage V1 is supplied to the output terminal Ta. Furthermore, the reset voltage VEXT is supplied to the output terminal Tb.

Subsequently, from time t27 to time t28, the boosting circuit 17A raises the voltage VTa of the output terminal Ta from the voltage V1 to the voltage VPGMH. The boosting circuit 17B raises the voltage VTb of the output terminal Tb from the reset voltage VEXT to the voltage VMREGSUP. That is, the voltage VPGMH is supplied to the output terminal Ta. Furthermore, the voltage VMREGSUP is supplied to the output terminal Tb.

When the program operation using the write voltage VPGM ends, from time t28 to time t29, the boosting circuit 17A decreases the voltage VTa of the output terminal Ta from the voltage VPGMH to the voltage V1. The boosting circuit 17B decreases the voltage VTb of the output terminal Tb from the voltage VMREGSUP to the reset voltage VEXT. That is, the voltage V1 is supplied to the output terminal Ta. Furthermore, the reset voltage VEXT is supplied to the output terminal Tb. This is the end of the write operation shown in FIG. 13.

2. 1. 2 Second Example

Figure 14:
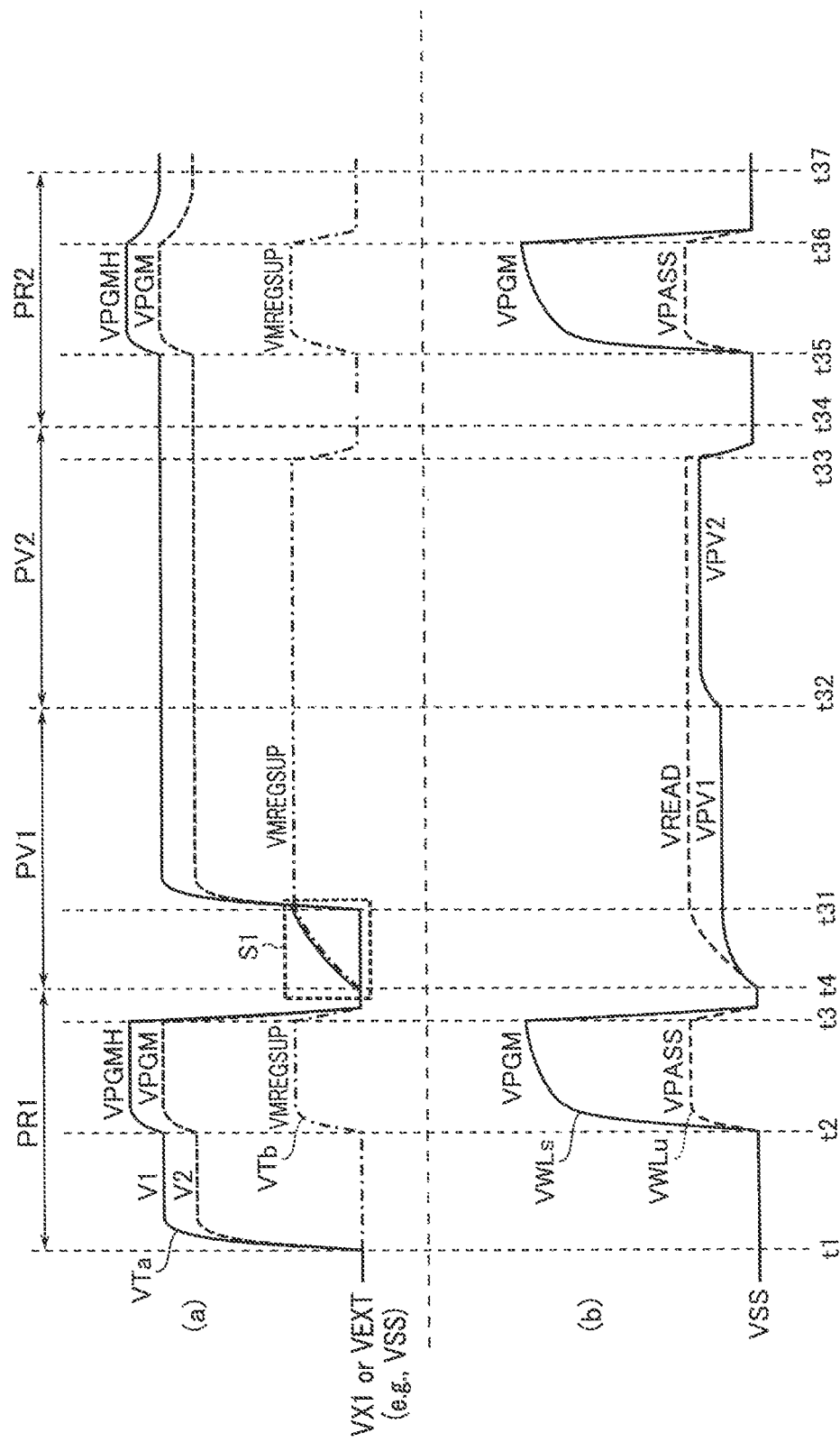
FIG. 14 is a diagram showing a voltage waveform in a write operation according to a second example of the second embodiment.

FIG. 14 is a diagram showing a voltage waveform in a write operation according to a second example of the second embodiment. FIG. 14(a) shows voltages of output terminals Ta and Tb of boosting circuits 17A and 17B in the program operation and the program verify operation. FIG. 14(b) shows voltages of the selected word line and the non-selected word lines in the memory cell array 10 in the program operation and the program verify operation.

Hereinafter, a description will be given of the voltage VWLs of the selected word line and the voltages VWLu of the non-selected word lines in the memory cell array 10 during the program operation and the program verify operation with reference to FIG. 14(b).

First, the program operation PR1 is performed. The voltages of the selected word line WLs and the non-selected word lines WLu from time t1 to time t4 are the same as those shown in FIG. 9(b). At time t1, the row decoder RDn sets the voltages of the selected word line WLs and the non-selected word lines WLu to the voltage VSS. Subsequently, from time t2 to time t3, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. Thereafter, when the program operation using the write voltage VPGM ends, from time t3 to time t4, the row decoder RDn decreases the voltage of the selected word line WLs from the write voltage VPGM to the voltage VSS. Also, the row decoder RDn decreases the voltages of the non-selected word lines WLu from the voltage VPASS to the voltage VSS.

Subsequently, the program verify operation PV1 is performed. From time t4 to time t32, the row decoder RDn raises the voltage VWLs of the selected word line WLs from the voltage VSS to the program verify voltage VPV1. Also, the row decoder RDn raises the voltages VWLu of the non-selected word lines WLu from the voltage VSS to the voltage VREAD. That is, from time t4 to time t32, the voltage of the selected word line WLs is boosted from the voltage VSS and set to the program verify voltage VPV1. The voltages of the non-selected word lines WLu are boosted from the voltage VSS and set to the voltage VREAD.

Thereafter, when the verify operation using the program verify voltage VPV1 ends, a verify operation using the program verify voltage VPV2 is performed next. From time t32 to time t33, the row decoder RDn raises the voltage VWLs of the selected word line WLs from the program verify voltage VPV1 to the program verify voltage VPV2. Also, the row decoder RDn maintains the voltages VWLu of the non-selected word lines WLu at the voltage VREAD. That is, from time t32 to time t33, the voltage of the selected word line WLs is boosted from the program verify voltage VPV1 and set to the program verify voltage VPV2. The voltages of the non-selected word lines WLu are maintained at the voltage VREAD.

Thereafter, when the verify operation using the program verify voltage VPV2 ends, from time t33 to time t34, the row decoder RDn decreases the voltage VWLs of the selected word line WLs from the program verify voltage VPV2 to the voltage VSS. Also, the row decoder RDn decreases the voltages VWLu of the non-selected word lines WLu from the voltage VREAD to the voltage VSS. That is, from time t33 to time t34, the voltage of the selected word line WLs is dropped from the program verify voltage VPV2 and set to the voltage VSS. The voltages of the non-selected word lines WLu are dropped from the voltage VREAD and set to the voltage VSS.

Subsequently, the program operation PR2 is performed. From time t35 to time t36, the row decoder RDn raises the voltage VWLs of the selected word line WLs from the voltage VSS to the write voltage VPGM. Also, the row decoder RDn raises the voltages VWLu of the non-selected word lines WLu from the voltage VSS to the voltage VPASS. That is, from time t35 to time t36, the voltage of the selected word line WLs is boosted from the voltage VSS and set to the write voltage VPGM. The voltages of the non-selected word lines WLu are boosted from the voltage VSS and set to the voltage VPASS.

Thereafter, when the program operation using the write voltage VPGM ends, from time t36 to time t37, the row decoder RDn decreases the voltage VWLs of the selected word line WLs from the write voltage VPGM to the voltage VSS. Also, the row decoder RDn decreases the voltages VWLu of the non-selected word lines WLu from the voltage VPASS to the voltage VSS. That is, the voltage of the selected word line WLs is dropped from the write voltage VPGM and set to the voltage VSS. The voltages of the non-selected word lines WLu are dropped from the voltage VPASS and set to the voltage VSS.

Next, a description will be given of the voltage VTa of the output terminal Ta and the voltage VTb of the output terminal Tb of the boosting circuits 17A and 17B with reference to FIG. 14 (a).

First, the voltages of the output terminals during execution of the program operation PR1 are set as follows. The voltages of the output terminals Ta and Tb from time t1 to time t4 are similar to the voltages shown in FIG. 9(a). At time t1, the boosting circuits 17A and 17B set the voltages of the output terminals Ta and Tb to the voltage VSS. Subsequently, from time t1 to time t2, the boosting circuit 17A raises the voltage VTa of the output terminal Ta from the voltage VSS to the voltage V1 lower than the voltage VPGMH. The boosting circuit 17B sets the voltage VTb of the output terminal Tb to the voltage VSS. Subsequently, from time t2 to time t3, the boosting circuit 17A raises the voltage of the output terminal Ta from the voltage V1 to the voltage VPGMH. The boosting circuit 17B raises the voltage of the output terminal Tb from the voltage VSS to the voltage VMREGSUP. Thereafter, when the program operation using the write voltage VPGM ends, from time t3 to time t4, the boosting circuit 17A decreases the voltage of the output terminal Ta from the voltage VPGMH to the reset voltage VX1 or a voltage close to the reset voltage VX1. The boosting circuit 17B decreases the voltage of the output terminal Tb from the voltage VMREGSUP to the reset voltage VEXT. Specifically, the voltage of the output terminal Ta is discharged and decreased from the voltage VPGMH to the reset voltage VX1 or the voltage close to the reset voltage VX1. Furthermore, the voltage of the output terminal Tb is discharged and decreased from the voltage VMREGSUP to the reset voltage VEXT. By discharging the voltage VPGMH of the output terminal Ta of the boosting circuit 17A to a sufficiently low reset voltage VX1, it is possible to prevent the transistor in the boosting circuit 17A from breaking down after the withstand voltage is exceeded.

Subsequently, the voltages of the output terminals during execution of the program verify operation PV1 are set as follows. From time t4 to time t31, the boosting circuit 17A raises the voltage VTa of the output terminal Ta from the reset voltage VX1 to the voltage VMREGSUP, as shown by S1 in FIG. 14 (a). The voltage VMREGSUP of the output terminal Ta is supplied to the driver 16. The driver 16 generates the voltage VREAD from the supplied voltage VMREGSUP. The driver 16 supplies the generated voltage VREAD to the non-selected word lines WLu via the row decoder module 15.

Here, since the boosting circuit 17A supplies the voltage VMREGSUP to the driver 16, the amount of current supplied from the driver 16 to the non-selected word lines WLu increases, thus helping boosting of the voltages of the non-selected word lines WLu from the voltage VSS to the voltage VREAD. This accelerates the voltages of the non-selected word lines WL arriving at the voltage VREAD from the voltage VSS. In other words, the time taken for the voltages of the non-selected word lines WLu to arrive at the voltage VREAD from the voltage VSS is shortened.

Similarly, from time t4 to time t31, the boosting circuit 17B raises the voltage VTb of the output terminal Tb from the reset voltage VEXT to the voltage VMREGSUP, as shown by S1 in FIG. 14 (a). The voltage VMREGSUP of the output terminal Tb is supplied to the driver 16. The driver 16 generates the voltage VREAD from the supplied voltage VMREGSUP. The driver 16 supplies the generated voltage VREAD to the non-selected word lines WLu via the row decoder module 15.

As described above, from time t4 to time t31, the voltage VMREGSUP is supplied from two circuits, namely, the boosting circuits 17A and 17B, to the driver 16. Originally, it was mainly the boosting circuit 17B that supplied the voltage VMREGSUP to the driver 16; in the present embodiment, however, the boosting circuit 17A also supplies the voltage VMREGSUP to the driver 16. That is, in addition to the voltage VMREGSUP supplied mainly from the boosting circuit 17B to the driver 16, the voltage VMREGSUP is also supplied subsidiarily from the boosting circuit 17A to the driver 16. Since the voltage VMREGSUP is supplied to the driver 16 from the boosting circuits 17A and 17B, the amount of current supplied from the driver 16 to the non-selected word lines WLu increases, thus accelerating boosting of the voltages of the non-selected word lines WLu from the voltage VSS to the voltage VREAD. This reduces the time taken for the voltages of the non-selected word lines WLu to reach the voltage VREAD. As a result, the time for the program verify operation PV1 is shortened.

Subsequently, from time t31 to time t32, the boosting circuit 17A raises the voltage VTa of the output terminal Ta from the voltage VMREGSUP to the voltage V1. That is, from time t31 to time t32, the voltage V1 is supplied to the output terminal Ta. The voltage of the output terminal Ta is not supplied to the word lines from time t31 to time t32. However, since there is a possibility that the program operation may be performed next, the voltage of the output terminal Ta is boosted to the voltage V1. In this example, since the sequencer 13 knows that the program verify operation PV2 is performed after the program verify operation PV1, the voltage VTa of the output terminal Ta is maintained at the voltage V1 at the end of the program verify operation PV1.

Also, from time t31 to time t32, the boosting circuit 17B maintains the voltage VTb of the output terminal Tb at the voltage VMREGSUP. That is, from time t31 to time t32, the voltage VMREGSUP is supplied to the output terminal Tb. As described above, in this example, since the sequencer 13 knows that the program verify operation PV2 is performed after the program verify operation PV1, the voltage VTb of the output terminal Tb is maintained at the voltage VMREGSUP at the end of the program verify operation PV1.

Thereafter, when the verify operation using the program verify voltage VPV1 ends, the program verify operation PV2 is performed next. The voltages of the output terminals during execution of the program verify operation PV2 are set as follows. From time t32 to t33, the boosting circuit 17A maintains the voltage VTa of the output terminal Ta at the voltage V1. The boosting circuit 17B maintains the voltage VTb of the output terminal Tb at the voltage VMREGSUP. That is, from time t32 to time t33, the voltage V1 is supplied to the output terminal Ta. Furthermore, the voltage VMREGSUP is supplied to the output terminal Tb.

Thereafter, when the verify operation using the program verify voltage VPV2 ends, from time t33 to time t34, the boosting circuit 17A maintains the voltage VTa of the output terminal Ta at the voltage V1. The boosting circuit 17B decreases the voltage VTb of the output terminal Tb from the voltage VMREGSUP to a reset voltage VEXT. That is, from time t33 to time t34, the voltage V1 is supplied to the output terminal Ta. Furthermore, the reset voltage VEXT is supplied to the output terminal Tb.

Subsequently, the voltages of the output terminals during execution of the program operation PR2 are set as follows. From time t34 to t35, the boosting circuit 17A maintains the voltage VTa of the output terminal Ta at the voltage V1. The boosting circuit 17B maintains the voltage VTb of the output terminal Tb at the reset voltage VEXT. That is, from time t34 to time t35, the voltage V1 is supplied to the output terminal Ta. Furthermore, the reset voltage VEXT is supplied to the output terminal Tb.

Subsequently, from time t35 to time t36, the boosting circuit 17A raises the voltage VTa of the output terminal Ta from the voltage V1 to the voltage VPGMH. The boosting circuit 17B raises the voltage VTb of the output terminal Tb from the reset voltage VEXT to the voltage VMREGSUP. That is, the voltage VPGMH is supplied to the output terminal Ta. Furthermore, the voltage VMREGSUP is supplied to the output terminal Tb.

When the program operation using the write voltage VPGM ends, from time t36 to time t37, the boosting circuit 17A decreases the voltage VTa of the output terminal Ta from the voltage VPGMH to the voltage V1. The boosting circuit 17B decreases the voltage VTb of the output terminal Tb from the voltage VMREGSUP to the reset voltage VEXT. That is, the voltage V1 is supplied to the output terminal Ta. Furthermore, the reset voltage VEXT is supplied to the output terminal Tb. This is the end of the write operation shown in FIG. 14.

2. 2 Advantageous Effects

According to the second embodiment, similarly to the first embodiment, it is possible to provide a semiconductor memory device capable of speeding up the write operation. That is, in the semiconductor memory device of the second embodiment, the write time required in the write operation can be shortened.

In the second embodiment, when the program verify operation is performed continuously in the write operation, namely, when the subsequent program verify operation is performed continuously after the previous program verify operation, since the boosting circuit 17A supplies the voltage VMREGSUP to the driver 16, the amount of current supplied from the driver 16 to the non-selected word lines WLu increases, thus helping boosting of the voltages of the non-selected word lines WLu from the voltage VSS to the voltage VREAD.

This shortens the voltages of the non-selected word lines WLu arriving at the voltage VREAD from the voltage VSS. By shortening the time for the non-selected word lines WLu to arrive at the voltage VREAD, the time for the program verify operations PV1 and PV2 can be reduced. It is thereby possible in the second embodiment to speed up the write operation, even when the program verify operation is performed continuously. That is, the write time required in the write operation can be shortened.

3. Modifications, Etc.

In the above-described embodiments, a NAND-type flash memory has been described as an example of a semiconductor memory device; however, the semiconductor memory device is not limited to a NAND-type flash memory, and is applicable to other semiconductor memory devices in general, as well as various types of storage devices other than semiconductor memories.

The embodiments described above are presented merely as examples and are not intended to restrict the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

The invention claimed is:

1. A semiconductor memory device comprising:
a first memory cell; and
a first boosting circuit including a first output terminal and configured to generate a first voltage, a second voltage, and a third voltage lower than the second voltage at the first output terminal, the first voltage, the second voltage and the third voltage being used for a write operation, wherein
the write operation includes a first program operation and a first verify operation, and
the first boosting circuit is configured to:
generate the first voltage at the first output terminal during the first program operation;
generate the third voltage at the first output terminal at end of the first program operation;
generate the second voltage at the first output terminal during the first verify operation; and then
generate the first voltage to the first output terminal during the first verify operation.

2. The semiconductor memory device according to claim 1, further comprising:
a first word line electrically coupled to the first memory cell;
a second memory cell;
a second word line electrically coupled to the second memory cell; and
a driver configured to generate a fourth voltage from the second voltage, wherein
a write voltage is generated from the first voltage generated by the first boosting circuit during the first program operation, and the write voltage is supplied to the first word line, and
the second voltage generated by the first boosting circuit is input to the driver during the first verify operation, and the fourth voltage generated by the driver is supplied to the second word line.

3. The semiconductor memory device according to claim 2, further comprising:
a second boosting circuit configured to generate the second voltage, wherein
the second voltage generated by the second boosting circuit is input to the driver during the first verify operation, and the fourth voltage generated by the driver is supplied to the second word line.

4. The semiconductor memory device according to claim 1, wherein
a second verify operation is performed continuously after the first verify operation, and
the first boosting circuit is configured to:
generate the third voltage at the first output terminal at end of the first verify operation; and
generate the second voltage at the first output terminal during the second verify operation, and then generate the first voltage to the first output terminal.

5. The semiconductor memory device according to claim 1, wherein
a second verify operation is performed continuously after the first verify operation, and
the first boosting circuit maintains the voltage of the first output terminal at the first voltage during the second verify operation.

6. The semiconductor memory device according to claim 1, wherein
a second program operation is performed after the first verify operation, and
the first boosting circuit generates the first voltage at the first output terminal before the second program operation is started and during the second program operation.

7. The semiconductor memory device according to claim 1, wherein
the first boosting circuit is configured to:
generate a fifth voltage at the first output terminal before generating the second voltage at the first output terminal during the first verify operation.

8. The semiconductor memory device according to claim 1, further comprising:
a transistor configured to transfer a write voltage to the first memory cell during the write operation, wherein
the first voltage is either a sixth voltage obtained by adding a voltage equal to or greater than a threshold voltage of the transistor to the write voltage, or a seventh voltage lower than the sixth voltage.

9. The semiconductor memory device according to claim 1, further comprising:
a second boosting circuit including a second output terminal and configured to generate an eighth voltage higher than the third voltage, wherein
the second boosting circuit generates the eighth voltage, and then generates the second voltage at the second output terminal, during the first program operation.

10. The semiconductor memory device according to claim 1, wherein
the first boosting circuit includes a plurality of charge pumps.

11. A semiconductor memory device comprising:
a first memory cell; and
a first boosting circuit including a first output terminal and configured to generate a first voltage, a second voltage, and a third voltage lower than the second voltage at the first output terminal, the first voltage, the second voltage and the third voltage being used for a write operation, wherein
the write operation includes a first program operation which writes data into the first memory cell and a first verify operation which is executed after the first program operation and determines the data written into the first memory cell, and
the first boosting circuit is configured to:
raise a voltage of the first output terminal to the first voltage during the first program operation, and decrease the voltage of the first output terminal from the first voltage to the third voltage at end of the first program operation; and
raise the voltage of the first output terminal from the third voltage to the second voltage at a start of the first verify operation, and then raise the voltage of the first output terminal from the second voltage to the first voltage during the first verify operation.

12. The semiconductor memory device according to claim 11, further comprising:
a first word line electrically coupled to the first memory cell;
a second memory cell;
a second word line electrically coupled to the second memory cell; and
a driver configured to generate a fourth voltage from the second voltage, wherein
a write voltage is generated from the first voltage generated by the first boosting circuit during the first program operation, and the write voltage is supplied to the first word line, and
the second voltage generated by the first boosting circuit is input to the driver during the first verify operation, and the fourth voltage generated by the driver is supplied to the second word line.

13. The semiconductor memory device according to claim 12, further comprising:
a second boosting circuit configured to generate the second voltage, wherein
the second voltage generated by the second boosting circuit is input to the driver during the first verify operation, and the fourth voltage generated by the driver is supplied to the second word line.

14. The semiconductor memory device according to claim 11, wherein
a second verify operation is performed continuously after the first verify operation, and
the first boosting circuit is configured to:
decrease the voltage of the first output terminal to the third voltage at end of the first verify operation; and
raise the voltage of the first output terminal from the third voltage to the second voltage during the second verify operation, and then raise the voltage of the first output terminal from the second voltage to the first voltage.

15. The semiconductor memory device according to claim 11, wherein
a second verify operation is performed continuously after the first verify operation, and
the first boosting circuit maintains the voltage of the first output terminal at the first voltage during the second verify operation.

16. The semiconductor memory device according to claim 11, wherein
a second program operation is performed after the first verify operation, and
the first boosting circuit generates the first voltage at the first output terminal before the second program operation is started and during the second program operation.

17. The semiconductor memory device according to claim 11, wherein
the first boosting circuit is configured to:
raise the voltage of the first output terminal from the third voltage to a fifth voltage and then change the voltage of the first output terminal from the fifth voltage to the second voltage, before raising the voltage of the first output terminal from the third voltage to the second voltage during the first verify operation.

18. The semiconductor memory device according to claim 11, further comprising:
a transistor configured to transfer a write voltage to the first memory cell during the write operation, wherein
the first voltage is either a sixth voltage obtained by adding a voltage equal to or greater than a threshold voltage of the transistor to the write voltage, or a seventh voltage lower than the sixth voltage.

19. The semiconductor memory device according to claim 11, further comprising:
a second boosting circuit including a second output terminal and configured to generate an eighth voltage higher than the third voltage, wherein
the second boosting circuit raises the voltage of the second output terminal to the eighth voltage, decrease the voltage of the second output terminal from the eight voltage to the third voltage, and then raises the voltage of the second output terminal from the third voltage to the second voltage, during the first program operation.

20. The semiconductor memory device according to claim 11, wherein
the first boosting circuit includes a plurality of charge pumps.

* * * * *